US011054455B2

(12) United States Patent
Hisatake

(10) Patent No.: US 11,054,455 B2
(45) Date of Patent: Jul. 6, 2021

(54) ELECTROMAGNETIC WAVE MEASUREMENT APPARATUS AND ELECTROMAGNETIC WAVE MEASUREMENT METHOD

(71) Applicant: Osaka University, Osaka (JP)

(72) Inventor: Shintarou Hisatake, Osaka (JP)

(73) Assignee: Osaka University, Osaka (JP)

(*) Notice: Subject to any disclaimer, the term of this patent is extended or adjusted under 35 U.S.C. 154(b) by 20 days.

(21) Appl. No.: 16/490,980

(22) PCT Filed: Mar. 6, 2018

(86) PCT No.: PCT/JP2018/008541
§ 371 (c)(1),
(2) Date: Sep. 4, 2019

(87) PCT Pub. No.: WO2018/164110
PCT Pub. Date: Sep. 13, 2018

(65) Prior Publication Data
US 2020/0011913 A1 Jan. 9, 2020

(30) Foreign Application Priority Data
Mar. 6, 2017 (JP) .................. 2017-041286

(51) Int. Cl.
*G01R 29/08* (2006.01)
(52) U.S. Cl.
CPC ................ *G01R 29/0885* (2013.01)
(58) Field of Classification Search
CPC ............ G01R 29/0885; G01R 29/0814; G01R 29/10; G01R 29/08
(Continued)

(56) References Cited

U.S. PATENT DOCUMENTS 4,446,425 A * 5/1984 Valdmanis ........... G01R 13/347
324/76.36
5,006,789 A * 4/1991 Williamson ........... G01R 1/071
324/754.06
(Continued)

FOREIGN PATENT DOCUMENTS

CN 106093598 A 11/2016
EP 3336562 A1 6/2018
(Continued)

OTHER PUBLICATIONS

Hisatake, S., Pham, H.H.N. and Nagatsuma, T., 2014. Visualization of the spatial-temporal evolution of continuous electromagnetic waves in the terahertz range based on photonics technology. Optica, 1(6), pp. 365-371. (Year: 2014).*

(Continued)

*Primary Examiner* — Christopher P McAndrew
(74) *Attorney, Agent, or Firm* — Morgan, Lewis & Bockius LLP

(57) ABSTRACT

An electromagnetic wave measurement apparatus includes: a probe light generation unit configured to generate probe light of two wavelengths; and an electro-optic probe configured to receive the probe light generated by the probe light generation unit and a detection target electromagnetic wave, wherein the probe light generation unit performs a fluctuation operation to cause a frequency difference of the probe light to fluctuate, and the content of the fluctuation operation is set so as to conform to specifications regarding frequency fluctuation of the detection target electromagnetic wave.

9 Claims, 28 Drawing Sheets

(58) Field of Classification Search
USPC .......................................................... 324/96
See application file for complete search history.

(56) References Cited

U.S. PATENT DOCUMENTS

| | | | | |
|---|---|---|---|---|
| 5,256,968 | A * | 10/1993 | Loualiche | G01R 31/308 324/76.36 |
| 5,281,912 | A * | 1/1994 | Togawa | G01R 33/0322 250/227.21 |
| 5,459,394 | A * | 10/1995 | De Kort | G01R 1/071 324/96 |
| 5,952,818 | A * | 9/1999 | Zhang | G01R 29/0885 324/96 |
| 6,414,473 | B1 * | 7/2002 | Zhang | G01R 29/0885 324/244.1 |
| 8,264,685 | B2 * | 9/2012 | Duvillaret | G01R 29/0885 356/364 |
| 8,957,677 | B2 * | 2/2015 | Nagasaka | G01R 33/0322 324/244.1 |
| 9,068,949 | B2 * | 6/2015 | Cheng | G01J 3/2803 |
| 2003/0067641 | A1 * | 4/2003 | Wein | G01J 4/04 398/5 |
| 2004/0067056 | A1 * | 4/2004 | Kido | G01M 11/338 398/9 |
| 2005/0100866 | A1 * | 5/2005 | Arnone | G01N 21/59 433/215 |
| 2007/0041729 | A1 * | 2/2007 | Heinz | H01L 31/02024 398/25 |
| 2011/0043653 | A1 * | 2/2011 | Ikeno | G01R 33/032 348/222.1 |
| 2013/0045008 | A1 | 2/2013 | Miyazaki et al. | |
| 2014/0354996 | A1 * | 12/2014 | Fontecchio | G01J 3/51 356/416 |
| 2017/0176548 | A1 * | 6/2017 | Wu | G01R 33/032 |
| 2018/0188305 | A1 | 7/2018 | Hisatake et al. | |
| 2018/0238948 | A1 | 8/2018 | Hisatake et al. | |
| 2018/0238949 | A1 * | 8/2018 | Shinagawa | H01S 3/0064 |

FOREIGN PATENT DOCUMENTS

| | | |
|---|---|---|
| JP | 2011-174709 A | 9/2011 |
| JP | 2013-210278 A | 10/2013 |
| JP | 2014-002005 A | 1/2014 |
| JP | 2014-035268 A | 2/2014 |
| JP | 2014-052272 A | 3/2014 |
| JP | 2014-215180 A | 11/2014 |
| JP | 2015-064505 A | 4/2015 |
| JP | 2017-015703 A | 1/2017 |
| WO | 2017/002782 A1 | 1/2017 |
| WO | 2017/026494 A1 | 2/2017 |

OTHER PUBLICATIONS

Yang, K., Katehi, L.P.B. and Whitaker, J.F., 2000. Electro-optic field mapping system utilizing external gallium arsenide probes. Applied Physics Letters, 77(4), pp. 486-488. (Year: 2000).*
Extended European Search Report issued in corresponding European Patent Application No. 18764651.8 dated Feb. 26, 2020.
International Search Report issued in corresponding International Patent Application No. PCT/JP2018/008541 dated May 29, 2018.
Bloecher et al., "79GHz UWB automotive short range radar—Spectrum allocation and technology trends," Advances in Radio Science, 7: 61-65 (2009).
Inoue, "Evaluation of electromagnetic characteristics of radar within car environment by large scale simulation," Tokyo Institute of Technology, Tsubame industrial trail use result report (2014) (see English abstract).
Hisatake, "Measurement of Millimeter-wave and Terahertz Wave based on Photonics Technology," Proceedings of the IEICE General Conference, The Institute of Electronics, Information and Communication Engineers, SS125-126 (Communications Lectures 2), Proceedings of the 2016 IEICE Society Conference (2016) (see partial English translation).
Yamaguchi et al., "Proof-of-concept Experiment to Asynchronously Measure FMCW Signal," Proceedings of the IEICE General Conference, the Institute of Electronics, Information and Communication Engineers (Electronics Lectures 1) (2017) (see partial English translation).
Yamaguchi et al., "Visualization of Electric-Field Radiation from Quasi-Millimeter-Wave FMCW Radar Based on Electrooptic Measurement," The IEICE Transactions on Electronics C, The Institute of Electronics, Information and Communication Engineers, J101-C (9): 336-343 (2018) (see partial English translation).
Hisatake et al., "Visualization of frequency-modulated electric field based on photonic frequency tracking in asynchronous electro-optic measurement system," Applied Physics Express, 11: 046601 (2018).

* cited by examiner

ELECTROMAGNETIC WAVE MEASUREMENT APPARATUS AND ELECTROMAGNETIC WAVE MEASUREMENT METHOD

TECHNICAL FIELD

The present invention relates to an electromagnetic wave measurement apparatus and an electromagnetic wave measurement method, and particularly to an electromagnetic wave measurement apparatus and an electromagnetic wave measurement method that employ an electro-optic crystal.

This application claims priority to Japanese Patent Application No. 2017-41286 filed on Mar. 6, 2017, the disclosure of which is entirely incorporated herein by reference.

BACKGROUND ART

Various apparatuses for detecting an electromagnetic wave, using an electro-optic crystal, have been developed. For example, Patent Document 1 (JP 2014-52272A) discloses the following technology as an example of such a technology for detecting an electromagnetic wave. That is, an electromagnetic wave detection system including: a first light source; a second light source that emits light at a frequency different from that of the first light source; a first optical branching device that branches the light from the first light source into two; a second optical branching device that branches the light from the second light source into two; a first optical multiplexer that multiplexes one of the two streams of light branched by the first optical branching device and one of the two streams of light branched by the second optical branching device; a second optical multiplexer that multiplexes the other one of the two streams of light branched by the first optical branching device and the other one of the two streams of light branched by the second optical branching device; an oscillator that outputs an oscillation signal at a constant frequency; a frequency shifter that is interposed between the first optical branching device and the first optical multiplexer, between the second optical branching device and the first optical multiplexer, between the first optical branching device and the second optical multiplexer, or between the second optical branching device and the second optical multiplexer, and uses the oscillation signal from the oscillator to shift the frequency of the light by the frequency of the oscillation signal; an RF signal generator that receives two types of light having different frequencies from the first optical multiplexer, generates a first RF (Radio Frequency) signal with a frequency equal to the difference between the two types of light, and emits the generated first RF signal to a measurement target; an RF signal detector that mixes the first RF signal that is transmitted through or reflected by the measurement target with LO (Local Oscillating) signals, which are the two types of light having different frequencies from the second optical multiplexer, subjects the resultant signal to heterodyne detection, and outputs a detection signal with a frequency equal to the difference between a frequency equal to the difference between the two types of light constituting the LO signals, and the frequency of the first RF signal; and a two phase lock-in detector that subjects the detection signal output by the RF signal detector to two phase lock-in detection using the oscillation signal output by the oscillator, and outputs an in-phase component that is in phase with the detection signal output by the RF signal detector, and an orthogonal component that has a phase orthogonal to the detection signal output by the RF signal detector.

Also, Patent Document 2 (JP 2017-15703A) discloses the following technology. That is, an electromagnetic wave measurement apparatus including a light source; an electro-optic probe configured to receive light from the light source and an electromagnetic wave; a light filter configured to receive light output from the electro-optic probe, and a light receiving element configured to convert light that has passed through the light filter into an electric signal, wherein the electro-optic probe includes: an electro-optic crystal; and an optical fiber optically coupled to the electro-optic crystal, a direction of a unique axis of the electro-optic crystal and a polarization direction of light from the optical fiber that enters the electro-optic crystal being set to be in line with each other.

CITATION LIST

Non-Patent Documents

Non-patent Document 1: H.-L. Bloecher et al., "79 GHz UWB automotive short range radar—Spectrum allocation and technology trends", Adv. Radio Sci., 7, 61-65, 2009

Non-patent Document 2: Daisuke Inoue, "Evaluation of electromagnetic characteristics of radar within car environment by large scale simulation", Tokyo Institute of Technology TSUBAME industrial trial use result report (year 2014), 2014

PATENT DOCUMENTS

Patent Document 1: JP 2014-52272A
Patent Document 2: JP 2017-15703A

DISCLOSURE OF THE INVENTION

Problem to be Solved by the Invention

There is a demand for a technology that is superior to the technologies disclosed in Patent Documents 1 and 2 and makes it possible to desirably measure an electromagnetic wave at low cost.

The present invention has been made in order to solve the above-described problem, and aims to provide an electromagnetic wave measurement apparatus and an electromagnetic wave measurement method that make it possible to desirably measure an electromagnetic wave at low cost, using an electro-optic crystal.

Means for Solving the Problem (1) To solve the above-described problem, an electromagnetic wave measurement apparatus according to one aspect of the invention includes: a probe light generation unit configured to generate probe light of two wavelengths; and an electro-optic probe that includes an electro-optic crystal and is configured to receive the probe light generated by the probe light generation unit and a detection target electromagnetic wave, wherein the probe light generation unit performs a fluctuation operation to cause a frequency difference of the probe light to fluctuate, and the content of the fluctuation operation is set so as to conform to specifications regarding frequency fluctuation of the detection target electromagnetic wave.

(8) To solve the above-described problem, an electromagnetic wave measurement method according to one aspect of the invention includes: a step of generating probe light of two wavelengths; and a step of supplying an electro-optic probe that includes an electro-optic crystal, with the probe light thus generated and a detection target electromagnetic wave, wherein a fluctuation operation is performed in the step of generating the probe light to cause a frequency difference of the probe light to fluctuate, and the content of the fluctuation operation conforms to specifications regarding frequency fluctuation of the detection target electromagnetic wave.

Effects of the Invention

According to the present invention, it is possible to desirably measure an electromagnetic wave at low cost, using an electro-optic crystal.

DESCRIPTION OF EMBODIMENTS

Figure 1:
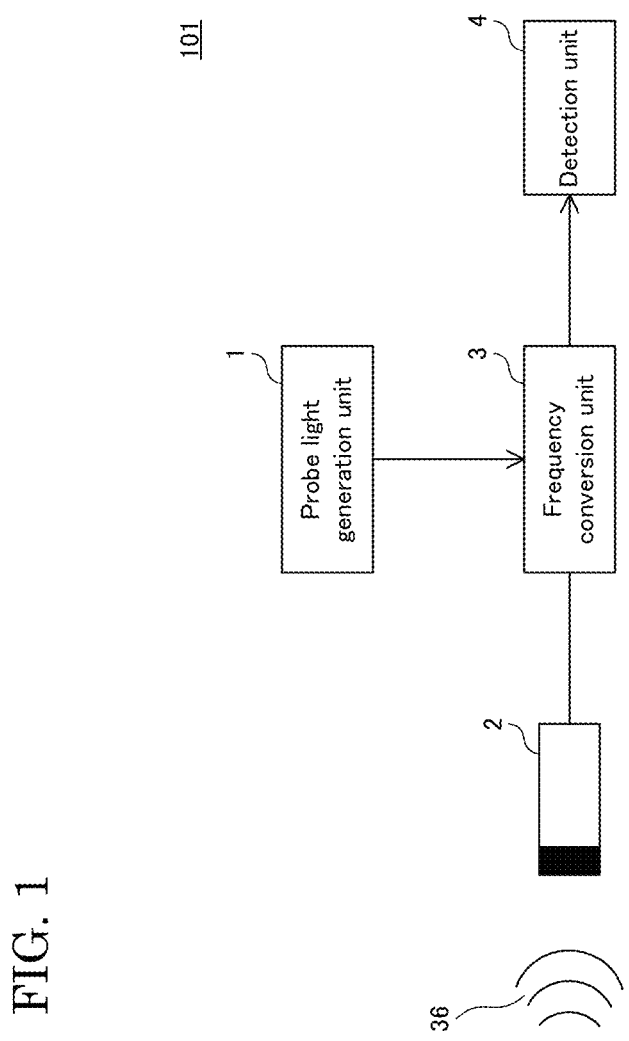
FIG. 1 is a diagram showing a configuration of an electromagnetic wave measurement apparatus according to a first embodiment of the present invention.

First, details of embodiments of the present invention will be described in order.

(1) An electromagnetic wave measurement apparatus according to an embodiment of the present invention includes: a probe light generation unit configured to generate probe light of two wavelengths; and an electro-optic probe that includes an electro-optic crystal and is configured to receive the probe light generated by the probe light generation unit and a detection target electromagnetic wave, wherein the probe light generation unit performs a fluctuation operation to cause a frequency difference of the probe light to fluctuate, and the content of the fluctuation operation is set so as to conform to specifications regarding frequency fluctuation of the detection target electromagnetic wave.

As described above, with the configuration in which the frequency difference of the probe light is caused to fluctuate in conformity with the specifications of the detection target electromagnetic wave, it is possible to reduce the frequency fluctuation of the electric signal that is based on the output light from the electro-optic probe. As a result, it is possible to significantly reduce the bandwidth that is required for a circuit that processes the electric signal, compared to the occupied bandwidth of the detection target electromagnetic wave, for example. Thus, it is possible to perform measurement that is advantageous in terms of the SN ratio, and it is possible to significantly reduce costs involved in the manufacturing of the circuit. Therefore, it is possible to desirably measure an electromagnetic wave at low cost, using an electro-optic crystal.

(2) Preferably, through the fluctuation operation, the probe light generation unit causes the frequency difference of the probe light to fluctuate such that a fluctuation range of a difference between the frequency difference of the probe light and a frequency of the detection target electromagnetic wave is smaller than a fluctuation range of the frequency of the detection target electromagnetic wave.

With such a configuration, it is possible to appropriately cause the frequency difference of the probe light to fluctuate, and significantly reduce the bandwidth that is required for a circuit that processes the electric signal that is based on the output light from the electro-optic probe, compared to the occupied bandwidth of the detection target electromagnetic wave, for example.

(3) Preferably, through the fluctuation operation, the probe light generation unit causes the frequency difference to fluctuate such that the frequency difference of the probe light follows the frequency fluctuation of the detection target electromagnetic wave.

Thus, with the configuration for causing the frequency difference of the probe light to follow the detection target electromagnetic wave, it is possible to easily reduce the frequency fluctuation of the electric signal that is based on the output light from the electro-optic probe.

(4) Preferably, the electromagnetic wave measurement apparatus further includes: a light receiving element configured to convert light that is based on light output from the electro-optic probe, into an electric signal, wherein the probe light generation unit controls fluctuation of the frequency difference through the fluctuation operation, based on a frequency of the electric signal converted by the light receiving element.

With such a configuration, it is possible to cause the frequency difference of the probe light to follow the detection target electromagnetic wave. Therefore, it is possible to suppress frequency drift of the electric signal converted by the light receiving element, for example, and obtain more stable measurement results.

(5) Preferably, the electromagnetic wave measurement apparatus further includes: an optical wavelength filter configured to receive light output from the electro-optic probe; and a light receiving element configured to convert light that has passed through the optical wavelength filter, into an electric signal, wherein a band of the optical wavelength filter does not include one of the frequencies of the probe light.

With such a configuration, it is possible to remove unnecessary components from the output light from the electro-optic probe, and obtain stable measurement results, while allowing specifications regarding the frequency fluctuation of the detection target electromagnetic wave. Also, it is possible to appropriately set the band of the optical wavelength filter, which is generally difficult to narrow, without setting it to be unnecessarily narrow. Therefore, it is possible to easily use the optical wavelength filter at low cost.

(6) Preferably, the electromagnetic wave measurement apparatus further includes: a polarization element configured to receive light output from the electro-optic probe; and a light receiving element configured to convert light that has passed through the polarization element, into an electric signal.

With such a configuration, it is possible to remove unnecessary components from the output light from the electro-optic probe, and obtain stable measurement results, while allowing specifications regarding the frequency fluctuation of the detection target electromagnetic wave.

(7) Preferably, the electro-optic probe is provided in a plurality, and each electro-optic probe receives the same probe light from the probe light generation unit.

With such a configuration, fluctuation, caused by the probe light, of the electric signals that are based on the output light from the electro-optic probes can be made the same as each other. Therefore, it is possible to easily remove the fluctuation, using a circuit that processes the electric signals, for example.

(8) Preferably, the electro-optic probe is provided in a plurality, and the electromagnetic wave measurement apparatus further includes: a plurality of optical wavelength filters or a plurality of polarization elements provided in correspondence with the electro-optic probes and each configured to receive light output from the electro-optic probe corresponding thereto; a plurality of light receiving elements provided in correspondence with the optical wavelength filters or the polarization elements and each configured to convert light that has passed through the optical wavelength filter or the polarization element corresponding thereto, into an electric signal; and a detection unit configured to detect a phase difference between electric signals converted by the light receiving elements.

As described above, by using a plurality of electro-optic probes placed in a measurement target space, a plurality of electro-optic probes can be placed at different points, and the relative frequency fluctuation of the measurement target electric field and the probe light can be cancelled out. Thus, it is possible to measure the relative phase difference between the measurement target electric fields at the points where the electro-optic probes are placed. Thus, even if the frequency of the electric field in the measurement target space fluctuates, it is possible to stably and accurately measure the spatial distribution of the amplitude and phase of the radiation electric field without synchronizing the measurement target system and the measurement system with each other.

(9) An electromagnetic wave measurement method according to an embodiment of the present invention includes: a step of generating probe light of two wavelengths; and a step of supplying an electro-optic probe that includes an electro-optic crystal, with the probe light thus generated and a detection target electromagnetic wave, wherein a fluctuation operation is performed in the step of generating the probe light to cause a frequency difference of the probe light to fluctuate, and the content of the fluctuation operation conforms to specifications regarding frequency fluctuation of the detection target electromagnetic wave.

As described above, with the method through which the frequency difference of the probe light is caused to fluctuate in conformity with the specifications of the detection target electromagnetic wave, it is possible to reduce the frequency fluctuation of the electric signal that is based on the output light from the electro-optic probe. As a result, it is possible to significantly reduce the bandwidth that is required for a circuit that processes the electric signal, compared to the occupied bandwidth of the detection target electromagnetic wave, for example. Thus, it is possible to perform measurement that is advantageous in terms of the SN ratio, and it is possible to significantly reduce costs involved in the manufacturing of the circuit. Therefore, it is possible to desirably measure an electromagnetic wave at low cost, using an electro-optic crystal.

Hereinafter, embodiments of the present invention will be described with reference to the drawings. Note that, in the drawings, the same reference numerals are given to the same or corresponding components in the drawings, and redundant descriptions thereof are not repeated. Furthermore, at least parts of the embodiments described below may be suitably combined.

First Embodiment

FIG. 1 is a diagram showing a configuration of an electromagnetic wave measurement apparatus according to a first embodiment of the present invention.

As shown in FIG. 1, an electromagnetic wave measurement apparatus 101 includes a probe light generation unit 1, a frequency conversion unit 3, and a detection unit 4. The frequency conversion unit 3 includes an electro-optic probe 2.

The electromagnetic wave measurement apparatus 101 measures a detection target electromagnetic wave 36. The detection target electromagnetic wave 36 is an electromagnetic wave in the RF band, for example.

In the electromagnetic wave measurement apparatus 101, the probe light generation unit 1 generates light rays of two wavelengths, i.e. two light rays of different frequencies, as probe light. Here, the frequency of probe light (hereinafter also referred to as the "probe frequency") is equivalent to the difference between the frequencies of the light rays of two wavelengths.

The electro-optic probe 2 includes an electro-optic crystal, and receives the probe light generated by the probe light generation unit 1 and the detection target electromagnetic wave 36. The electrooptic probe 2 detects the detection target electromagnetic wave 36.

More specifically, the probe light transmitted from the probe light generation unit 1 to the electro-optic probe 2 in the frequency conversion unit 3 interacts with the detection target electromagnetic wave 36 in the electro-optic probe 2, and is reflected and output. In the electro-optic probe 2, the phase, frequency, intensity, polarization state, or the like of the probe light is modulated by the detection target electromagnetic wave 36.

The frequency conversion unit 3 generates an electric signal in the intermediate frequency (IF) band (hereinafter referred to as the "IF signal") from the probe light output from the electro-optic probe 2, and outputs it to the detection unit 4. For example, the amplitude and phase of the detection target electromagnetic wave 36 have been coherently copied to this IF signal.

The detection unit 4 measures the detection target electromagnetic wave 36 based on the IF signal received from the frequency conversion unit 3.

Note that optical transmission between the constituent elements of the electromagnetic wave measurement apparatus 101 may be realized using an optical fiber or realized as space transmission. Examples of a configuration for space transmission include a configuration in which an electro-optic crystal member is provided on a semiconductor integrated circuit that outputs the detection target electromagnetic wave 36, and the member is irradiated with probe light that has been condensed by an object lens.

Figure 2:
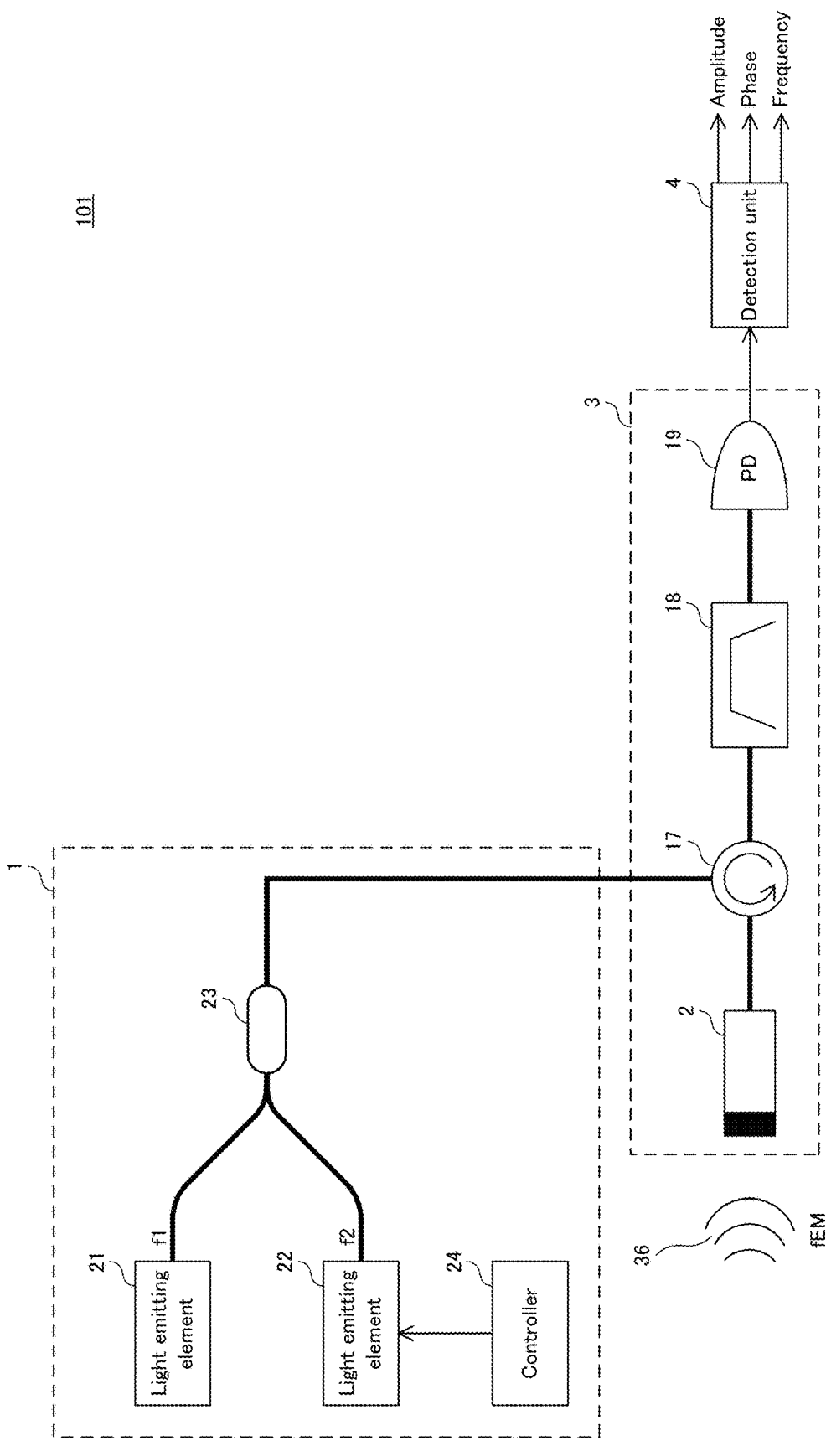
FIG. 2 is a diagram showing a configuration of the electromagnetic wave measurement apparatus according to the first embodiment of the present invention.

FIG. 2 is a diagram showing a configuration of the electromagnetic wave measurement apparatus according to the first embodiment of the present invention.

As shown in FIG. 2, the probe light generation unit 1 in the electromagnetic wave measurement apparatus 101 includes light emitting elements 21 and 22, an optical multiplexer 23, and a controller 24. The frequency conversion unit 3 includes the electro-optic probe 2, a circulator 17, an optical wavelength filter 18, and a light receiving element (PD) 19.

The electromagnetic wave measurement apparatus 101 can perform asynchronous measurement in which the detection target electromagnetic wave 36 and the probe light are not synchronized with each other.

More specifically, the light emitting element 21 emits light of a frequency f1. The light emitting element 22 emits light of a frequency f2 that is different from the frequency f1. The following describes an example in which f2>f1 is satisfied. Also, fEM≠f2−f1 is satisfied, where fEM denotes the frequency of the detection target electromagnetic wave 36.

The optical multiplexer 23 combines light that has been received from the light emitting element 21 and light that has been received from the light emitting element 22 with each other, and outputs the combined light to the electro-optic probe 2 via the circulator 17 as probe light.

Light that has been transmitted from the circulator 17 to the electro-optic probe 2 interacts with the detection target electromagnetic wave 36 in the electro-optic probe 2, and is reflected and output to the circulator 17, and is thereafter output from the circulator 17 to the optical wavelength filter 18.

The optical wavelength filter 18 receives the light output from the electro-optic probe 2. More specifically, the optical wavelength filter 18 attenuates frequency components that are not in a predetermined frequency band, of the frequency components of the light received from circulator 17, for example. The optical wavelength filter 18 is a band pass filter, for example.

The light receiving element 19 converts light that is based on the light output from the electro-optic probe 2, into an electric signal. More specifically, the light receiving element 19 converts light that has passed through the optical wavelength filter 18, into an electric signal, and outputs the electric signal to the detection unit 4.

The detection unit 4 detects the amplitude and phase of the electric signal received from the light receiving element 19, and outputs signals respectively indicating the detected amplitude and phase, for example. Alternatively, the detection unit 4 may detect the frequency of the electric signal, using the frequency of probe light, and output a signal that indicates the detected frequency. Note that the detection unit 4 may be configured to detect one or two of the amplitude, phase, and frequency of the electric signal received from the light receiving element 19.

As described above, the electromagnetic wave measurement apparatus 101 employs an optical technology to perform electromagnetic wave measurement in a wide band from a low frequency to a high frequency, while changing the position of the electro-optic probe 2, for example. Thus, the electromagnetic wave measurement apparatus 101 can measure spatial distribution regarding the electric field of the electromagnetic wave. Also, the electromagnetic wave measurement apparatus 101 can measure the amplitude, phase, and frequency of the electric field in real time.

Figure 3:
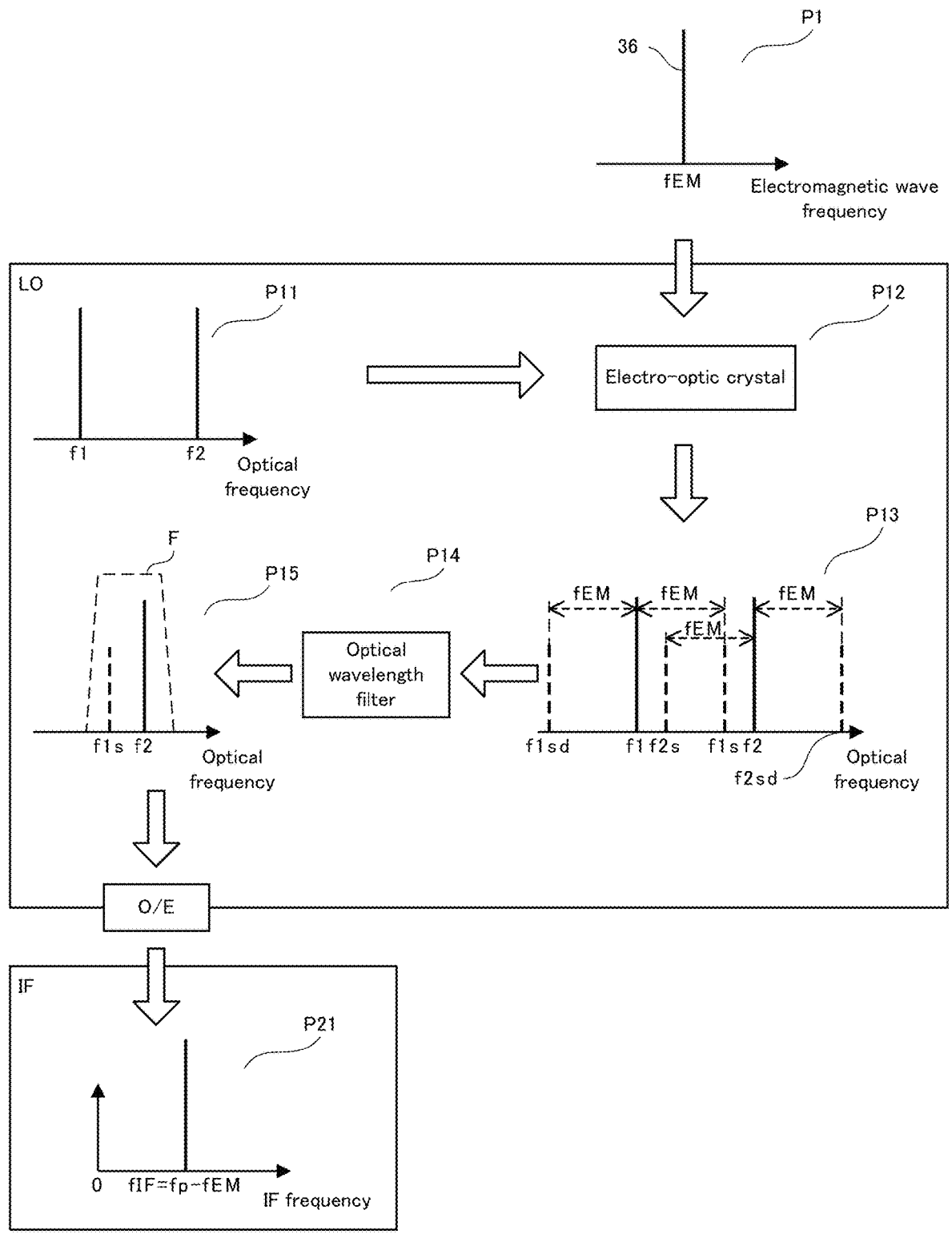
FIG. 3 is a diagram showing the measurement principle of the electromagnetic wave measurement apparatus according to the first embodiment of the present invention.

FIG. 3 is a diagram showing the measurement principle of the electromagnetic wave measurement apparatus according to the first embodiment of the present invention.

To facilitate understanding, the following describes an example in which the detection target electromagnetic wave 36 is a continuous wave (CW), with reference to FIGS. 2 and 3.

The detection target electromagnetic wave 36 of the frequency fEM is emitted toward the electro-optic crystal in the electro-optic probe 2 (a phase P1). Also, the combined light generated from the light of the frequency f1 and the light of the frequency f2 in the optical multiplexer 23 (a phase P11) is transmitted to the electro-optic crystal in the electro-optic probe 2 as probe light (a phase P12).

A component of the frequency f1 and a component of the frequency f2 of the probe light are modulated in the electro-optic crystal irradiated with the detection target electromagnetic wave 36, and thus components of light in modulated sidebands, specifically components of light of frequencies f1s=f1+fEM, f2s=f2−fEM, f1sd=f1−fEM, and f2sd=f2+fEM, are generated (a phase P13). The components of light thus generated are transmitted to the optical wavelength filter 18 together with the components of the frequency f1 and the frequency f2 of the probe light (a phase P14).

Probe light of the frequency f2 and light of the frequency f1s in the modulated sideband are extracted by the optical wavelength filter 18 having a passband F, for example (phase P15).

The light extracted by the optical wavelength filter 18 is transmitted to the light receiving element 19 and is subjected to photoelectric conversion (O/E), and thus an electric signal of a frequency f1F=f2−f1s=fp−fEM in the IF band is obtained (a phase P21).

The IF signal output from the light receiving element 19, i.e. the electric signal in the IF band resulting from heterodyne detection of light of the frequency f1s and light of the frequency f2, includes information regarding the amplitude and phase of the detection target electromagnetic wave 36.

Note that probe light of the frequency f1 and the light of the frequency f2s in the modulated sideband may be extracted by the optical wavelength filter 18.

Again, as shown in FIG. 2, the detection unit 4 is, for example, a lock-in amplifier that includes a mixer, a filter, a phase shifter, and the like, and generates an electric signal in the baseband from the electric signal in the IF band received from the light receiving element 19, and detects the amplitude and phase of the electric signal in the IF band, i.e. detects the amplitude and phase of a modulated sideband component.

As described above, the electromagnetic wave measuring apparatus 101 makes it possible to measure the electric field, i.e., the amplitude and phase, of the detection target electromagnetic wave 36.

Here, the following is an example of such a problem. That is, it has been pointed out that a beam pattern radiated from an on-board millimeter-wave radar is distorted due to the influence of vehicle parts that are located around the radar apparatus (c.f. Non-patent Document 1 (H.-L. Bloecher et al., "79 GHz UWB automotive short range radar—Spectrum allocation and technology trends", Adv. Radio Sci., 7, 61-65, 2009)).

Such distortion of the beam pattern is considered to be a cause of unforeseeable misdetection. However, there is no means for identifying where and how the beam pattern is distorted, through actual measurement, and there is great need for a means for realizing such measurement.

At present, it is common to test whether or not a reflector that is placed in front of the vehicle can be properly detected by the radar apparatus. However, although this test reveals the fact that misdetection has occurred, it is impossible to identify the cause of the distortion of the beam pattern that leads to misdetection. Specifically, it is impossible to identify which vehicle part causes what kind of distortion.

The same problem exists in far-field measurement, which is a common antenna measurement method. Meanwhile, research has been conducted to find the cause of distortion based on electromagnetic field simulation performed after modeling vehicle parts with high accuracy (c.f. Non-patent Document 2 (Daisuke Inoue, "Evaluation of electromagnetic characteristics of radar within car environment by large scale simulation", Tokyo Institute of Technology, TSUBAME industrial trial use result report (year 2014), 2014)).

However, such a method is not realistic in terms of computation time. In addition, in the first place, it is difficult to determine how much a simulation reflects reality because there is a luck of data such as the complex dielectric constant of paint.

Under such circumstances, automobile manufacturers make an effort to reduce misdetection through trial and error, and determine whether or not the expected misdetection rate is within an acceptable range, based on a running test performed over several hundred thousand hours.

In order to realize an autonomous car society in the future, it is necessary to begin with establishing not only design/evaluation techniques that are not based on trial and error, but also a test method for ensuring the security of a radar system mounted on sold vehicles, including an indicator that can be used in the test.

In order to solve these problems, there is a strong need for measurement, in a near field of a vehicle, of an electric field radiated from the radar apparatus mounted on the real vehicle, i.e. measurement of the amplitude and phase distribution.

An EO sensing method utilizing an electrooptic (EO) effect is an excellent method that can achieve near-field measurement with low disturbance. However, if this method is applied to measurement of a radar signal using a conventional technique, it is necessary to employ a signal processing circuit with a bandwidth that is the same as or greater than that of the radar signal.

For example, in the case of a 79 GHz-band frequency modulated-continuous wave (FM-CW) radar, the radar signal is modulated within the range of 77 GHz to 81 GHz, and the occupied bandwidth is 4 GHz. Therefore, it is necessary to employ a signal processing circuit with a wide bandwidth that is greater than or equal to 4 GHz.

Such a configuration not only increases equipment costs by double digits, but also lowers the signal to noise ratio (S/N ratio) by triple digits or more. Therefore, it is almost impossible to measure the radar signal using conventional technology with the sensitivity of EO sensing at present.

Figure 4:
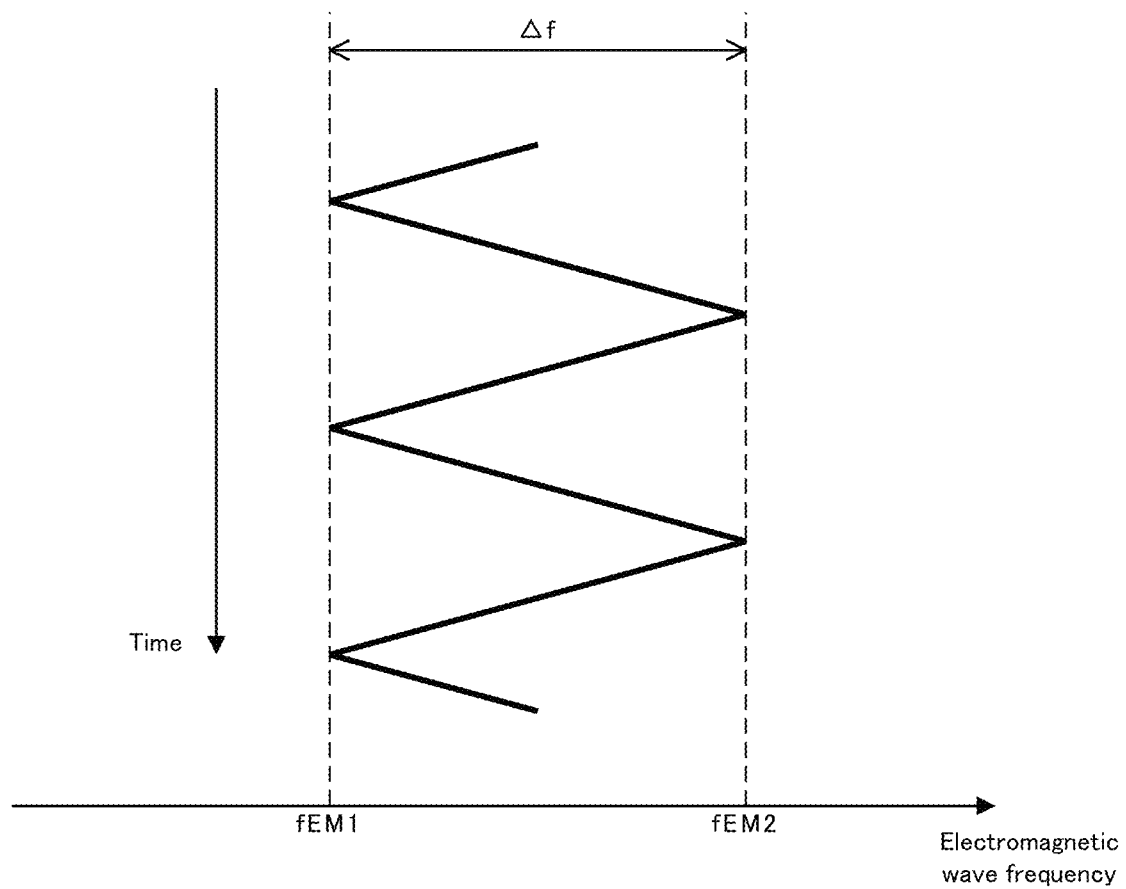
FIG. 4 is a diagram showing an example of an electromagnetic wave that is a measurement target of the electromagnetic wave measurement apparatus according to the first embodiment of the present invention.

FIG. 4 is a diagram showing an example of an electromagnetic wave that is a measurement target of the electromagnetic wave measurement apparatus according to the first embodiment of the present invention.

As shown in FIG. 4, the detection target electromagnetic wave 36 is an electromagnetic wave that is transmitted to detect a subject, for example, and the frequency thereof fluctuates according to predetermined specifications. Specifically, for example, the detection target electromagnetic wave 36 is an electromagnetic wave that conforms to the FM-CW system, and is a triangular wave of which the frequency fluctuates within a frequency modulation range $\Delta f$ from a frequency fEM1 to a frequency fEM2. The detection target electromagnetic wave 36 may be a sawtooth wave. Also, the detection target electromagnetic wave 36 may be an electromagnetic wave that conforms to another system such as a dual-frequency CW system.

Figure 5:
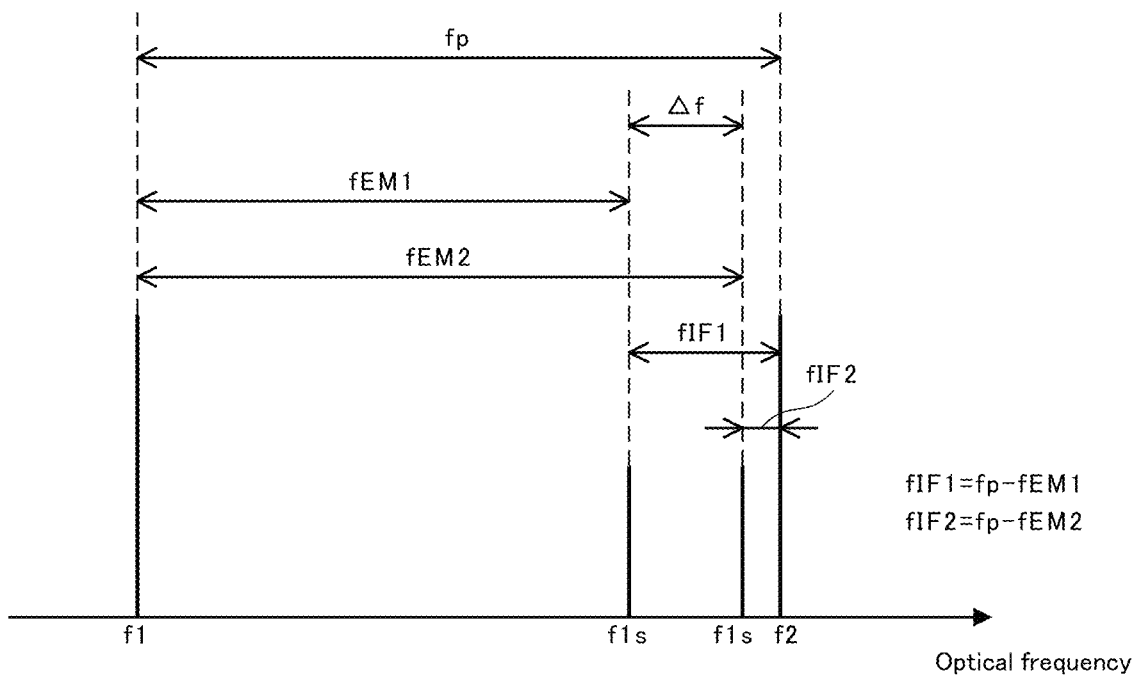
FIG. 5 is a diagram showing an example of the frequency of the IF signal in a comparative example of the electromagnetic wave measurement apparatus according to the first embodiment of the present invention.

FIG. 5 is a diagram showing an example of the frequency of the IF signal in a comparative example of the electromagnetic wave measurement apparatus according to the first embodiment of the present invention.

In this comparative example, the probe frequency fp is fixed.

A relative fluctuation of the frequency of probe light, i.e. the probe frequency fp, which is the difference between the frequency f1 and the frequency f2, and the frequency of the detection target electromagnetic wave 36, is superimposed on the IF signal generated by the frequency conversion unit 3.

That is to say, in the comparative example, the IF signal is subjected to the same frequency modulation as the detection target electromagnetic wave 36.

Specifically, as shown in FIG. 5, the frequency fIF1 of the IF signal when the frequency of the detection target electromagnetic wave 36 is fEM1 is fp−fEM1. The frequency fIF2 of the IF signal when the frequency of the detection target electromagnetic wave 36 is fEM2 is fp−fEM2. That is to say, the frequency of the IF signal fluctuates with the frequency modulation range $\Delta f$.

For example, in the case of a 79 GHz-band FM-CW radar, the radar signal is modulated within the range of 77 GHz to 81 GHz, and the occupied bandwidth is 4 GHz. Therefore, it is necessary to process the IF signal with a wide bandwidth of at least 4 GHz, using a signal processing circuit or the like in the detection unit 4 that is coupled to the output of the frequency conversion unit 3.

Therefore, the electromagnetic wave measurement apparatus 101 solves the above-described problem with the following configuration and operations.

Again, as shown in FIG. 2, the probe light generation unit 1 in the electromagnetic wave measurement apparatus 101 performs a fluctuation operation to cause the difference between the frequencies of probe light, i.e. the probe frequency, to fluctuate. This fluctuation operation is set so as to conform to specifications regarding the frequency fluctuation of the detection target electromagnetic wave 36, i.e. the predetermined frequency fluctuation of the detection target electromagnetic wave 36. In other words, the probe light generation unit 1 causes the frequency difference of probe light to fluctuate according to specifications regarding the frequency fluctuation of the detection target electromagnetic wave 36, i.e. the predetermined frequency fluctuation of the detection target electromagnetic wave 36.

For example, through the fluctuation operation, the probe light generation unit 1 causes the frequency difference of probe light to fluctuate such that the fluctuation range of the difference between the frequency difference of probe light and the frequency of the detection target electromagnetic wave 36 is smaller than the fluctuation range of the frequency of the detection target electromagnetic wave 36, e.g. the above-described frequency modulation range $\Delta f$.

More specifically, the controller 24 in the probe light generation unit 1 controls the light emitting element 22 to cause the frequency f2 of the output light from the light emitting element 22 to fluctuate within the frequency modulation range $\Delta f$.

Note that the electromagnetic wave measurement apparatus 101 may include a phase setting unit that can set the phase of the temporal fluctuation of the frequency difference of probe light such that the temporal fluctuation of the frequency difference is in phase with the temporal fluctuation of the frequency of the detection target electromagnetic wave 36. Specifically, for example, the phase setting unit controls the angle of the diffracting grating of the light emitting element 22, or controls the current supplied to the light emitting element 22.

Figure 6:
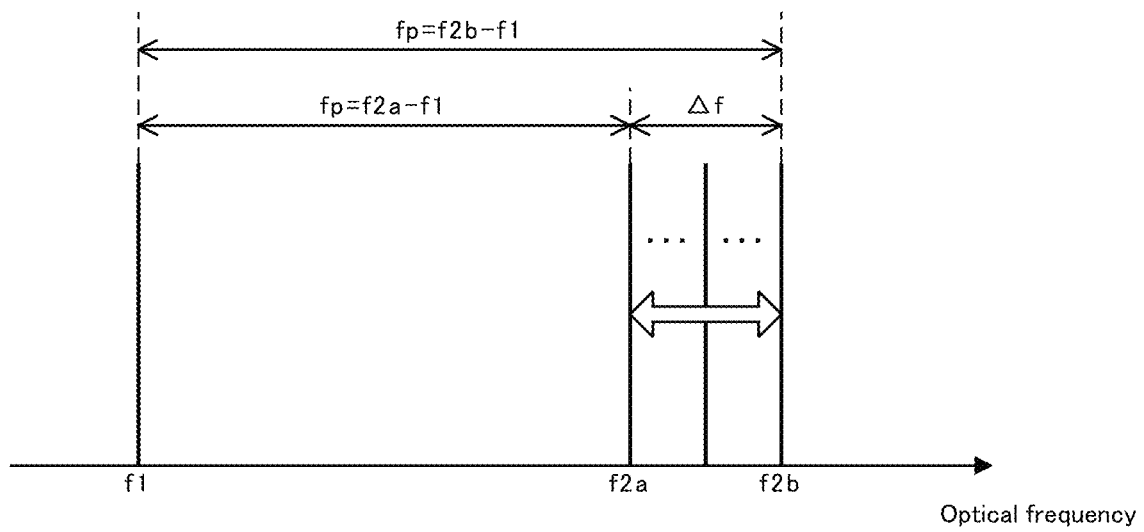
FIG. 6 is a diagram showing an example of probe light control performed by the electromagnetic wave measurement apparatus according to the first embodiment of the present invention.

FIG. 6 is a diagram showing an example of probe light control performed by the electromagnetic wave measurement apparatus according to the first embodiment of the present invention.

As shown in FIG. 6, the controller 24 causes the frequency of the output light from the light emitting element 22 to fluctuate within the frequency modulation range $\Delta f$ from a frequency f2a to a frequency f2b. That is, $f2b-f2a=fEM2-fEM1=\Delta f$ is satisfied.

As a result, the probe frequency fp fluctuates within the frequency modulation range $\Delta f$ from f2a−f1 to f2b−f1.

Note that the electromagnetic wave measurement apparatus 101 is not limited to being configured to cause the frequency f2 of the output light from the light emitting element 22 to fluctuate, and may be configured to cause the frequency f1 of the output light from the light emitting element 21 to fluctuate within the frequency modulation range $\Delta f$. Also, the electromagnetic wave measurement apparatus 101 may be configured to cause both the frequency f1 of the output light from the light emitting element 21 and the frequency f2 of the output light from the light emitting element 22 to fluctuate.

Figure 7:
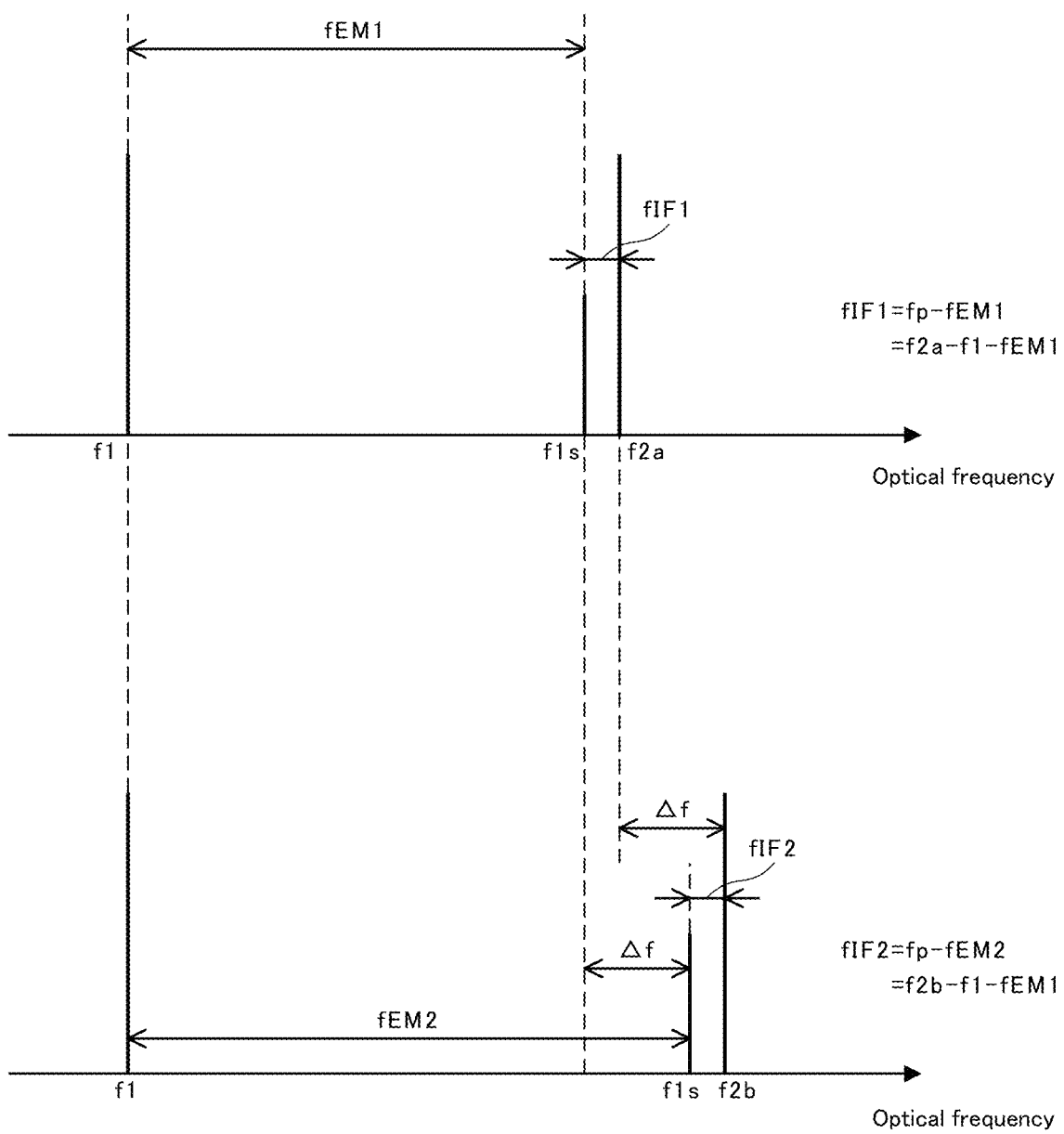
FIG. 7 is a diagram showing an example of the frequency of the IF signal in the electromagnetic wave measurement apparatus according to the first embodiment of the present invention.

FIG. 7 is a diagram showing an example of the frequency of the IF signal in the electromagnetic wave measurement apparatus according to the first embodiment of the present invention.

As shown in FIG. 7, in an ideal case in which the probe frequency fp fluctuates as shown in FIG. 6 and, for example, the frequency fluctuation of the output light from the light emitting element 22 is in phase with the frequency fluctuation of the detection target electromagnetic wave 36, the frequency fIF of the IF signal is constant.

Specifically, if the frequency of the output light from the light emitting element 22 is f2a when the frequency of the detection target electromagnetic wave 36 is fEM1, the frequency of the IF signal is fIF1=fp−fEM1=f2a−f1−fEM1.

If the frequency of the output light from the light emitting element 22 is f2b when the frequency of the detection target electromagnetic wave 36 is fEM2, the frequency of the IF signal is fIF2=fp−fEM2=f2b−f1−fEM2.

fEM2=fEM1+$\Delta f$ and f2b=f2a+f are satisfied, and therefore fIF1=fIF2 is satisfied.

As described above, if specifications regarding the frequency fluctuation of the detection target electromagnetic wave 36 are known, the configuration for fluctuating the probe frequency fp in conformity with the specifications of the detection target electromagnetic wave 36 can significantly reduce the frequency fluctuation of the IF signal.

Due to this effect, it is possible to lower the frequency of the IF signal, and therefore it is possible to realize the detection unit 4 using a low-cost, low-speed signal processing circuit or the like.

That is, the electromagnetic wave measurement apparatus 101 can convert a wide band signal into a narrow-band, low-frequency signal, using an optical technology. Thus, it is possible to accurately measure an electromagnetic wave with known frequency fluctuation, such as the electric field of a FM-CW radar, using a low-cost, low-speed signal processing circuit or the like.

In order to facilitate understanding, in the example described here, the frequency fluctuation of the probe frequency fp is in phase with the frequency fluctuation of the detection target electromagnetic wave 36 as shown in FIG. 7. However, the present invention is not limited to such a configuration. Even if the frequency fluctuation of the probe frequency fp is out of phase with the frequency fluctuation of the detection target electromagnetic wave 36 to some extent, the above-described effect can be achieved. For example, it is possible to appropriately set the degree of accuracy of matching between the phase of the frequency fluctuation of the probe frequency fp and the phase of the frequency fluctuation of the detection target electromagnetic wave 36 according to specifications required for the electromagnetic wave measurement apparatus 101.

Figure 8:
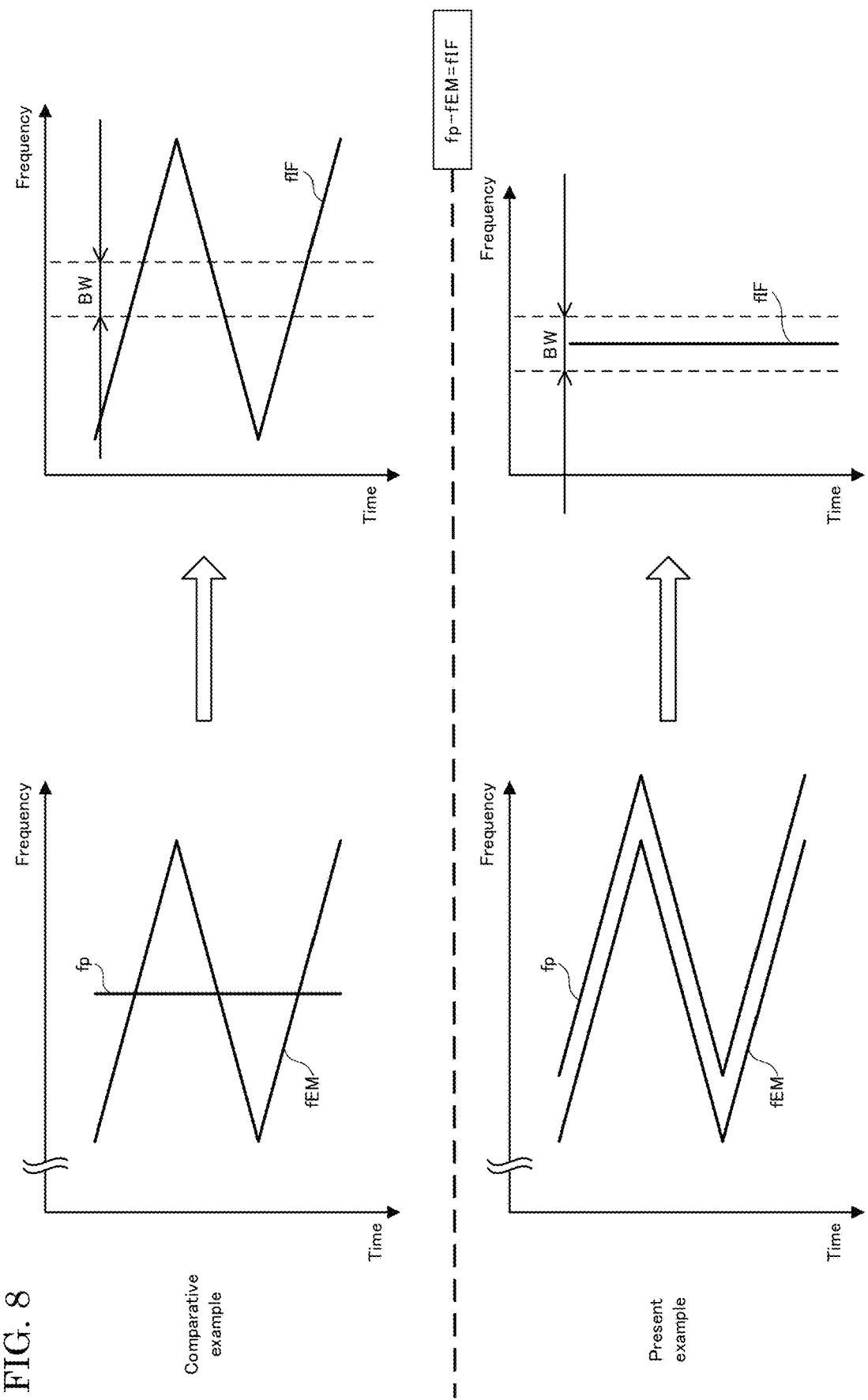
FIG. 8 is a diagram showing an example of an effect of probe frequency control performed by the electromagnetic wave measurement apparatus according to the first embodiment of the present invention.

FIG. 8 is a diagram showing an example of an effect of probe frequency control performed by the electromagnetic wave measurement apparatus according to the first embodiment of the present invention.

With a configuration in which the frequency difference between the frequency f1 and the frequency f2 is subjected to frequency modulation in the same manner as a radar signal that conforms to the FM-CW system, it is possible to easily reduce the frequency fluctuation range of the IF signal to several megahertz, even though there is some degree of relative frequency fluctuation in the detection target electromagnetic wave 36 and the probe light.

As a result, technical specifications required for the signal processing circuit or the like at a subsequent stage become much less demanding. Also, by using a low-frequency signal as a signal input to the detection unit 4, it is possible to make it easier to perform relative phase detection or the like, using a relative phase detection circuit in which an analog mixer described below is used, or using digital signal processing.

As shown in FIG. 8, in the above-described comparative example, even though the frequency fEM of the detection target electromagnetic wave 36 that conforms to the FM-CW system fluctuates, the probe frequency fp is constant. Therefore, the frequency fIF of the IF signal does not fall within a desired band BW of a filter or the like of the detection unit 4.

In contrast, the electromagnetic wave measurement apparatus 101 causes the probe frequency fp to fluctuate in the same manner as the frequency fEM of the detection target electromagnetic wave 36 that fluctuates, and thus can make the frequency fIF of the IF signal approximately constant. As a result, it is possible to make the frequency fIF of the IF signal fall within the desired band BW of a filter or the like of the detection unit 4.

Figure 9:
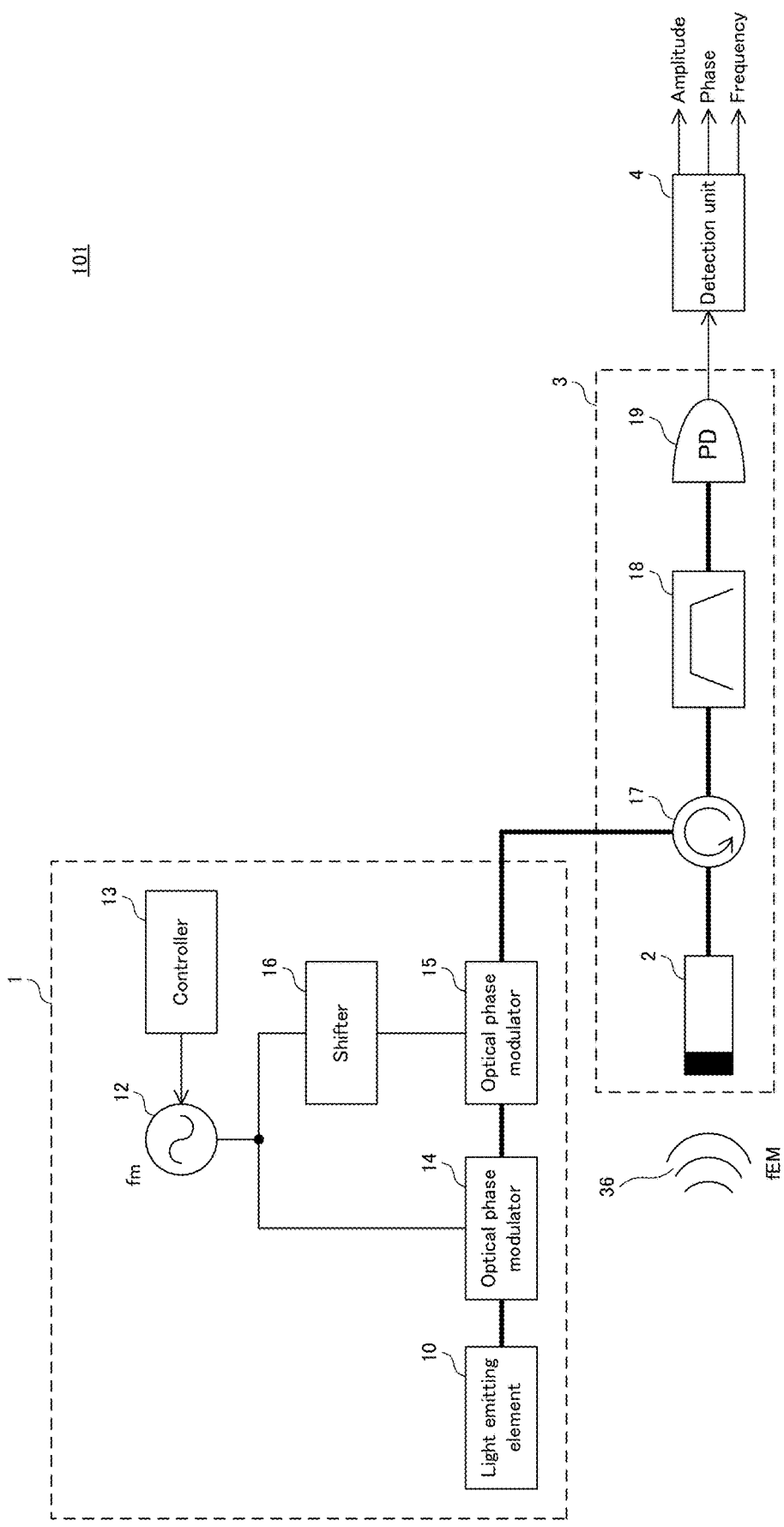
FIG. 9 is a diagram showing a configuration of a modification of the electromagnetic wave measurement apparatus according to the first embodiment of the present invention.

FIG. 9 is a diagram showing a configuration of a modification of the electromagnetic wave measurement apparatus according to the first embodiment of the present invention.

As shown in FIG. 9, in the modification of the electromagnetic wave measurement apparatus 101, the probe light generation unit 1 includes a light emitting element 10, optical phase modulators 14 and 15, a shifter 16, an oscillator 12, and a controller 13. The frequency conversion unit 3 includes the electro-optic probe 2, the circulator 17, the optical wavelength filter 18, and the light receiving element (PD) 19.

As with the electromagnetic wave measurement apparatus 101, this modification can perform asynchronous measurement in which the detection target electromagnetic wave 36 and the probe light are not synchronized with each other.

The optical phase modulator 14 performs phase modulation on seed light received from the light emitting element 10, using an oscillation signal of a frequency fm received from the oscillator 12, and outputs the resultant light.

The shifter 16 shifts the phase of the oscillation signal received from the oscillator 12, and outputs the resultant signal to the optical phase modulator 15.

The optical phase modulator 15 performs phase modulation on the light received from the optical phase modulator 14, using the oscillation signal received from the shifter 16, and outputs the resultant light.

Light that has been transmitted from the optical phase modulator 15 to the electro-optic probe 2 via the circulator 17 interacts with the detection target electromagnetic wave 36 in the electro-optic probe 2, and is reflected and output to the circulator 17, and is thereafter output from the circulator 17 to the optical wavelength filter 18.

Figure 10:
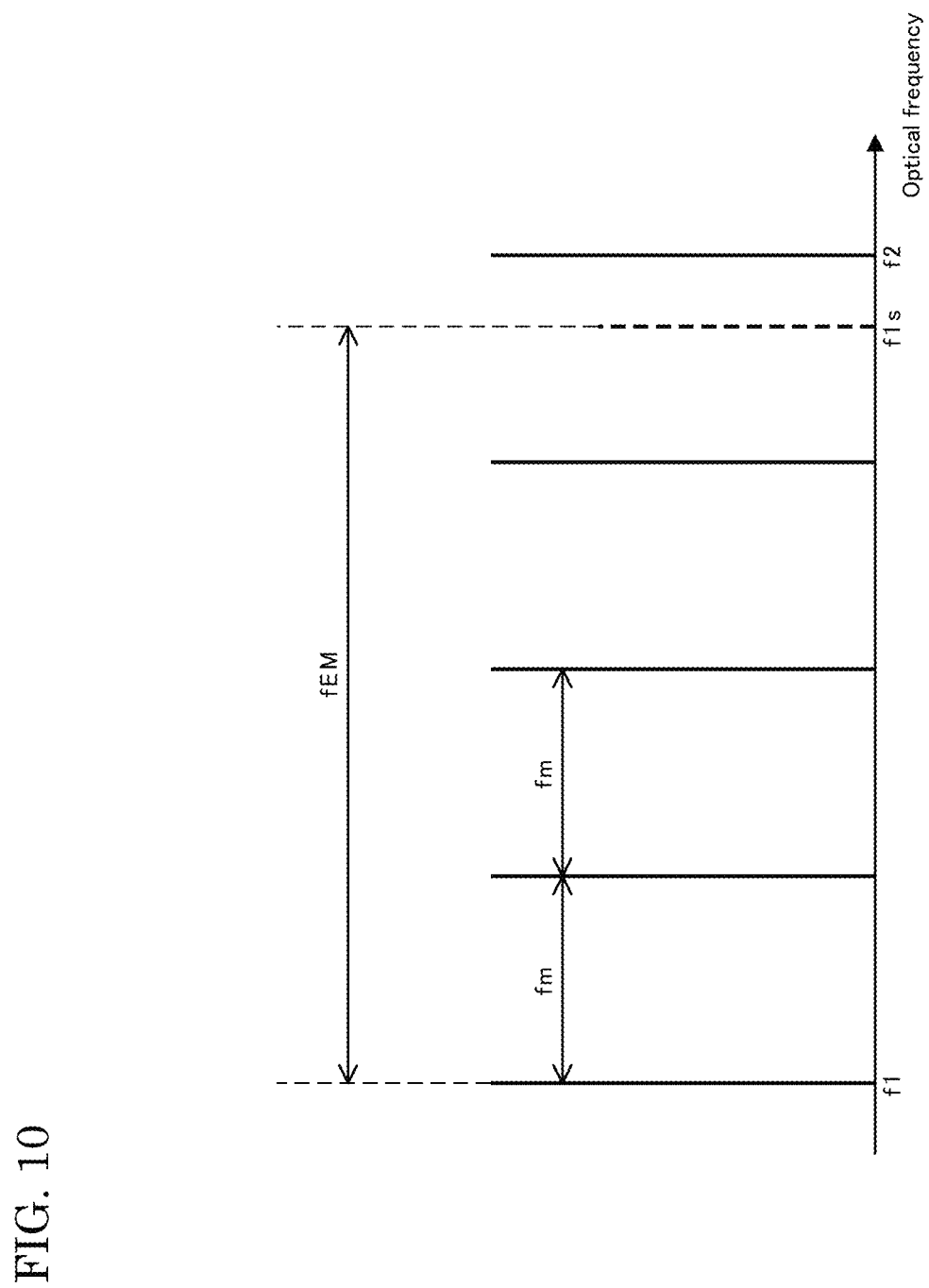
FIG. 10 is a diagram showing an example of probe light and an example of a modulated sideband modulated using an electro-optic crystal in the modification of the electromagnetic wave measurement apparatus according to the first embodiment of the present invention.

FIG. 10 is a diagram showing an example of probe light and an example of a modulated sideband modulated using an electro-optic crystal in the modification of the electromagnetic wave measurement apparatus according to the first embodiment of the present invention.

As shown in FIG. 10, the probe light generation unit 1 generates an optical frequency comb, specifically a plurality of light rays of a single frequency that are arranged at intervals of the frequency fm of the oscillation signal output from the oscillator 12. That is to say, a modulated sideband group consisting of a plurality of light rays of a single frequency arranged at intervals of the frequency fm is output from the optical phase modulator 15 to the circulator 17. This modulated sideband group includes probe light of two wavelengths, e.g. a light ray of the frequency f1 and a light ray of the frequency f2.

The circulator 17 receives such an optical frequency comb from the optical phase modulator 15, and outputs it to the electro-optic probe 2.

In the electro-optic probe 2, the detection target electromagnetic wave 36 of the frequency fEM and the components of the optical frequency comb from the circulator 17 interact with each other, and thus new sideband components are generated from the components. Note that FIG. 10 only shows the component of the frequency $f1s=(f1+fEM)$, which is a single sideband light ray to which attention is to be paid, and shows the frequencies f1 and f2 corresponding to the frequency of probe light.

The optical wavelength filter 18 attenuates frequency components that are not in a predetermined frequency band, of the frequency components of the light received from the circulator 17, for example. More specifically, the optical wavelength filter 18 is a band pass filter that selects a light ray in a single sideband generated in the electro-optic probe 2, and a certain component of the optical frequency comb received by the circulator 17, from the light received by the circulator 17. In this example, the optical wavelength filter 18 outputs light of a frequency $f1+fEM$ and light of the frequency f2. Note that $fEM \neq f2-f1$ should be satisfied. In this example, $fEM<(f2--=4 \times fm$ is satisfied.

The light receiving element 19 converts light that has passed through the optical wavelength filter 18, into an electric signal, and outputs the electric signal to the detection unit 4.

Although two optical phase modulators are used to generate an optical frequency comb in this modification, the present invention is not limited to such a configuration. For example, it is also possible to employ a configuration in which a mode-locked laser is used, a configuration in which a phase modulator and an intensity modulator are used, a configuration in which one phase modulator is used, or a configuration in which one intensity modulator is used.

As in the electromagnetic wave measurement apparatus 101, the probe light generation unit 1 in the modification performs a fluctuation operation to cause the difference between the frequencies of probe light, i.e. the probe frequency, to fluctuate. This fluctuation operation is set so as to conform to specifications regarding the frequency fluctuation of the detection target electromagnetic wave 36, i.e. the predetermined frequency fluctuation of the detection target electromagnetic wave 36. In other words, the probe light generation unit 1 causes the frequency difference of probe light to fluctuate according to specifications regarding the frequency fluctuation of the detection target electromagnetic wave 36.

For example, through the fluctuation operation, the probe light generation unit 1 causes the frequency difference of probe light to fluctuate such that the fluctuation range of the difference between the frequency difference of probe light and the frequency of the detection target electromagnetic wave 36 is smaller than the fluctuation range of the frequency of the detection target electromagnetic wave 36, e.g. the above-described frequency modulation range $\Delta f$.

More specifically, the controller 13 in the probe light generation unit 1 controls the oscillator 12 to cause the frequency fm of the oscillation signal from the oscillator 12 to fluctuate.

Note that the modification of the electromagnetic wave measurement apparatus 101 may include a phase setting unit that can set the phase of the temporal fluctuation of the frequency difference of probe light such that the temporal fluctuation of the frequency difference is in phase with the temporal fluctuation of the frequency of the detection target electromagnetic wave 36. Specifically, for example, the controller 13 serves as a phase setting unit, and controls the phase of a voltage that is supplied to the oscillator 12, or outputs the setting value of the phase to the oscillator 12.

Figure 11:
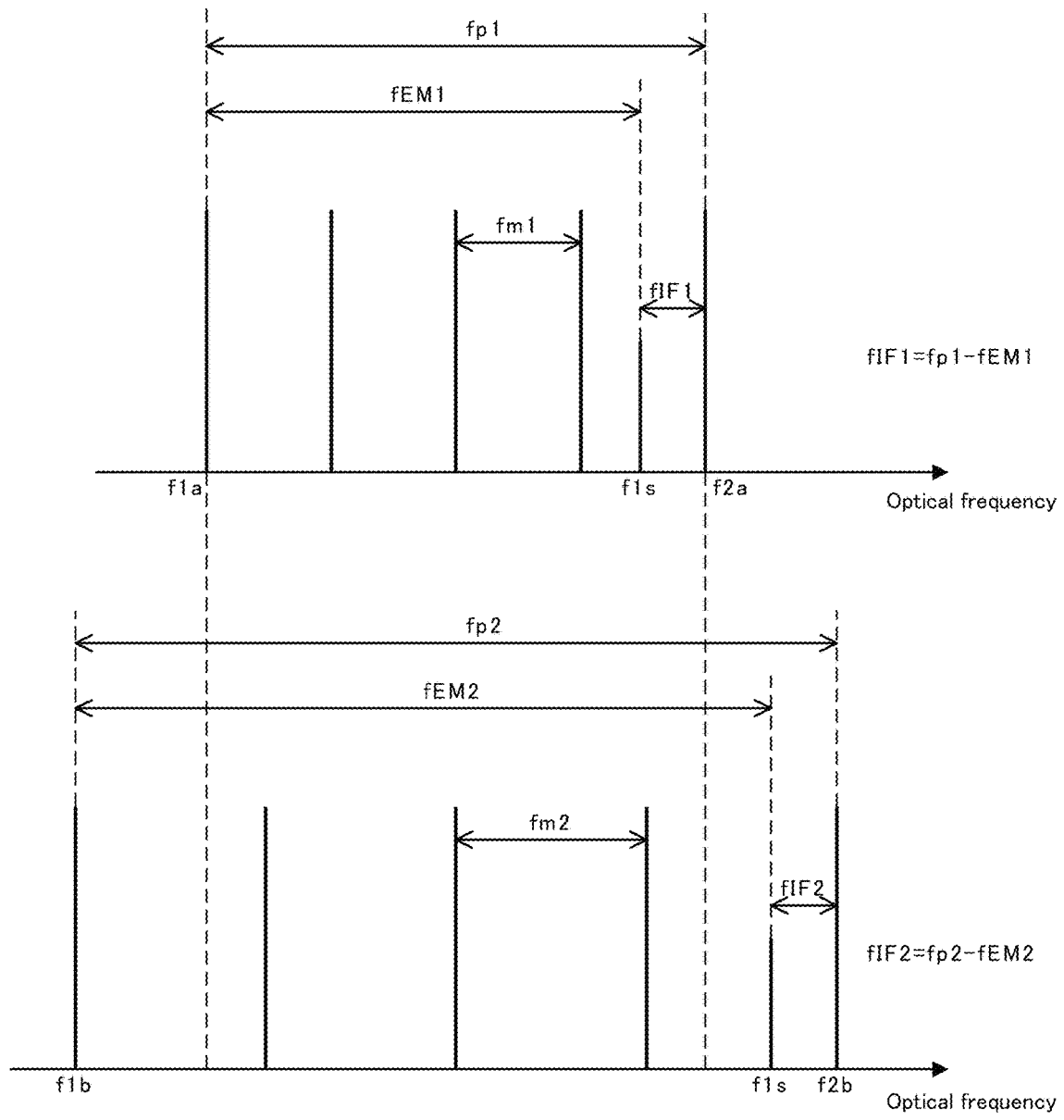
FIG. 11 is a diagram showing an example of probe light control and an example of the frequency of the IF signal in the modification of the electromagnetic wave measurement apparatus according to the first embodiment of the present invention.

FIG. 11 is a diagram showing an example of probe light control and an example of the frequency of the IF signal in the modification of the electromagnetic wave measurement apparatus according to the first embodiment of the present invention.

As shown in FIG. 11, the controller 13 causes the frequency fm of the oscillation signal from the oscillator 12 to fluctuate within the frequency modulation range from the frequency fm1 to the frequency fm2.

As a result, the probe frequency fp fluctuates within the frequency modulation range $\Delta f$ from $4 \times fm1 = fp1$ to $4 \times fm2 = fp2$. The controller 13 causes the frequency fm to fluctuate such that $4 \times fm2 - 4 \times fm1 = fEM2 - fEM1 = \Delta f$ is satisfied.

In an ideal case in which the probe frequency fp fluctuates as shown in FIG. 11, and, for example, the frequency fluctuation of the probe frequency fp matches the frequency fluctuation of the detection target electromagnetic wave 36, the frequency fIF of the IF signal is constant.

Specifically, if the frequency of the oscillation signal from the oscillator 12 is fm1 when the frequency of the detection target electromagnetic wave 36 is fEM1, the frequency of the IF signal is $fIF1 = fp1 - fEM1$.

If the frequency of the oscillation signal from the oscillator 12 is fm2 when the frequency of the detection target electromagnetic wave 36 is fEM2, the frequency of the IF signal is $fIF2 = fp2 - fEM2$.

$fEM2 = fEM1 + \Delta f$ and $fp2 = fp1 + \Delta f$ are satisfied, and therefore $fIF1 = fIF2$ is satisfied.

As described above, if specifications regarding the frequency fluctuation of the detection target electromagnetic wave 36 are known, the configuration for fluctuating the probe frequency fp in conformity with the specifications of the detection target electromagnetic wave 36 can significantly reduce the frequency fluctuation of the IF signal, as with the electromagnetic wave measurement apparatus 101.

Due to this effect, it is possible to lower the frequency of the IF signal, and therefore it is possible to realize the detection unit 4 using a low-cost, low-speed signal processing circuit or the like.

Although one pair of light rays with two wavelengths in the optical frequency comb, i.e. a light ray of the frequency f1 and a light ray of the frequency f2, are used in this modification, the present invention is not limited to such a configuration. It is possible to employ a configuration in which a plurality of pairs of light rays with two wavelengths in the optical frequency comb are used. Specifically, it is possible to employ a configuration in which a light ray of the frequency f1 and a light ray of the frequency f2, and components that are adjacent thereto, namely a light ray of a frequency f1+fm and a light ray of a frequency f2+fm, are used to output a light ray of a frequency f1+fEM and a light ray of a frequency f2, and a light ray of a frequency f1+fm+fEM and a light ray of a frequency f2+fm to the light receiving element 19.

Here, it is preferable that the band of the optical wavelength filter 18 does not include one of the frequencies of the probe light. If this is the case, the probe light ray of the frequency f1 or the frequency f2 is not in the band of the optical wavelength filter 18.

With a configuration as shown in FIG. 3 in which probe light of the frequency f2 and light of the frequency f1s in the modulated sideband are extracted, it is necessary to set the band of the optical wavelength filter 18 so as to be greater than the frequency modulation range of the detection target electromagnetic wave 36. In contrast, with the configuration for extracting the probe light of the frequency f1 and the light of the frequency f2s in the modulated sideband, the frequency f1 and the frequency f2s are constant when the frequency of the detection target electromagnetic wave 36 is fEM1 and fEM2, and therefore it is unnecessary to set the band of the optical wavelength filter 18 so as to be greater than the frequency modulation range of the detection target electromagnetic wave 36.

Also, with the configuration in which the optical frequency comb shown in FIG. 10 is used, it is necessary to set the band of the optical wavelength filter 18 so as to be greater than $\frac{1}{2}$ of the frequency modulation range $\Delta f$ of the detection target electromagnetic wave 36 and smaller than the frequency fm.

Considering the above facts, it is preferable that the optical wavelength filter 18 is set such that the probe light of one of the frequencies f1 and f2 is included in a stopband. As a result, it is possible to obtain the IF signal at the light receiving element 19. Specifically, with such a setting, it is possible to prevent the electric signal of f2−f1s and the electric signal of f1−f2s, which are in opposite phase, from cancelling each other out.

The optical wavelength filter 18 is not limited to a bandpass filter, and may be a notch filter or a combination thereof, provided that one of the frequencies f1 and f2 is included in the stopband of the optical wavelength filter 18.

With the configuration in which the band of the optical wavelength filter 18 does not include one of the frequencies of the probe light, it is possible to remove unnecessary components from the output light from the electro-optic probe 2, and obtain stable measurement results, while allowing specifications regarding the frequency fluctuation of the detection target electromagnetic wave 36. Also, it is possible to appropriately set the band of the optical wavelength filter, which is generally difficult to narrow, without setting it to be unnecessarily narrow. Therefore, it is possible to easily use the optical wavelength filter at low cost.

Here, the probe light generation unit 1 may be configured to cause the frequency difference of probe light to fluctuate, through the fluctuation operation, such that the frequency difference follows the frequency fluctuation of the detection target electromagnetic wave 36. As a result, the fluctuation operation is automatically set so as to conform to specifications regarding the frequency fluctuation of the detection target electromagnetic wave 36, and the phase of the temporal fluctuation in the frequency difference of the probe light is automatically set so as to match the phase of the temporal fluctuation in the frequency of the detection target electromagnetic wave 36.

Specifically, for example, the probe light generation unit 1 controls the fluctuation of the frequency difference of the probe light through the fluctuation operation based on the frequency of the electric signal converted by the light receiving element 19. For example, the probe light generation unit 1 controls the initial phase, period, fluctuation range, and so on of the frequency difference that fluctuates in the shape of a triangular wave.

Figure 12:
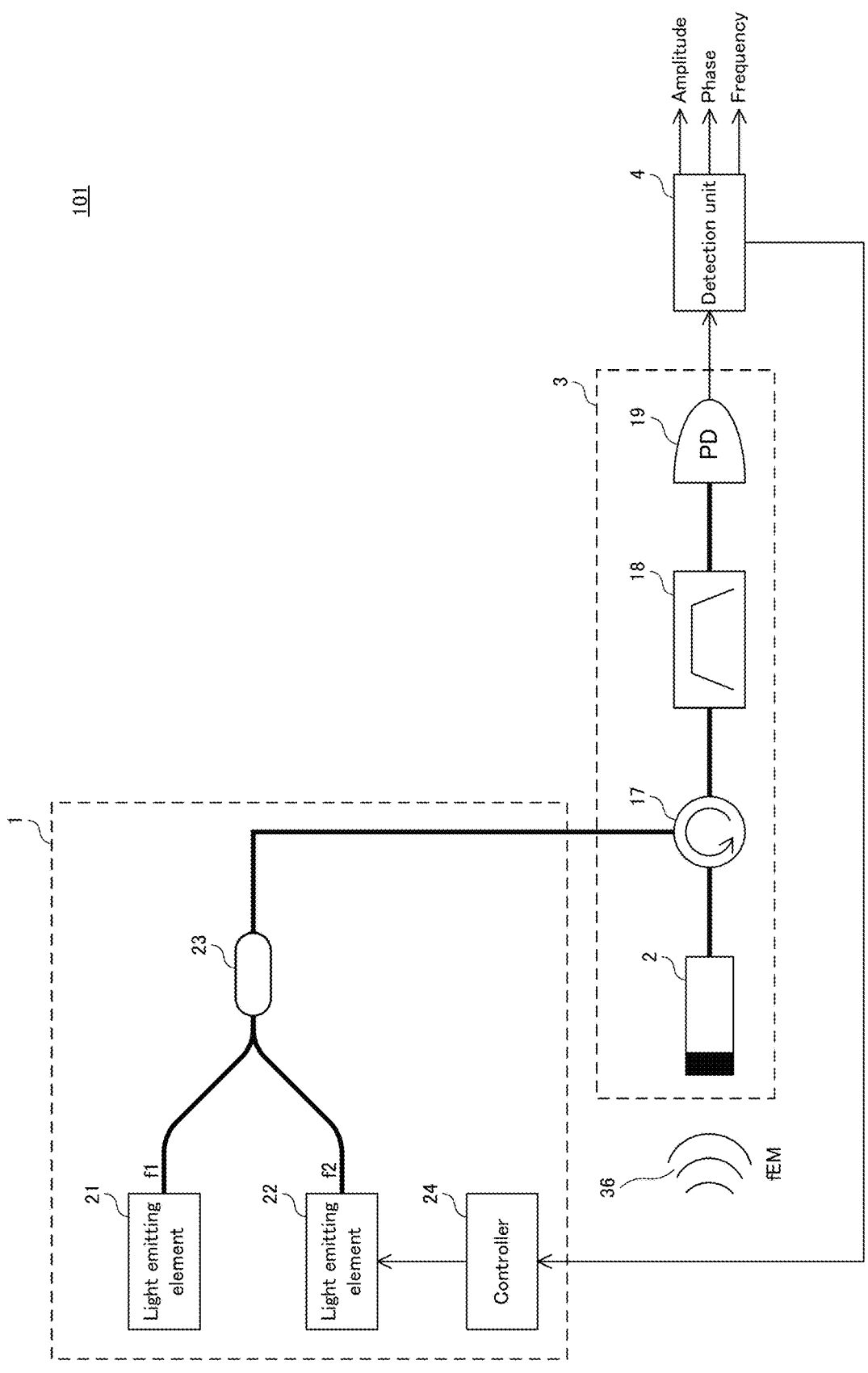
FIG. 12 is a diagram showing a configuration of a modification of the electromagnetic wave measurement apparatus according to the first embodiment of the present invention.

FIG. 12 is a diagram showing a configuration of a modification of the electromagnetic wave measurement apparatus according to the first embodiment of the present invention. This modification is the same as the electromagnetic wave measurement apparatus 101 shown in FIG. 2 except for the features described below.

As shown in FIG. 12, the controller 24 controls the phase of the frequency waveform of the output light from the light emitting element 22 or the frequency of the output light such that the frequency of the IF signal detected by the detection unit 4 is constant or falls within a desired bandwidth. If this is the case, the controller 24 also serves as a phase setting unit that sets the phase of the temporal fluctuation of the frequency difference of the probe light so as to match the phase of the temporal fluctuation of the frequency of the detection target electromagnetic wave 36.

Figure 13:
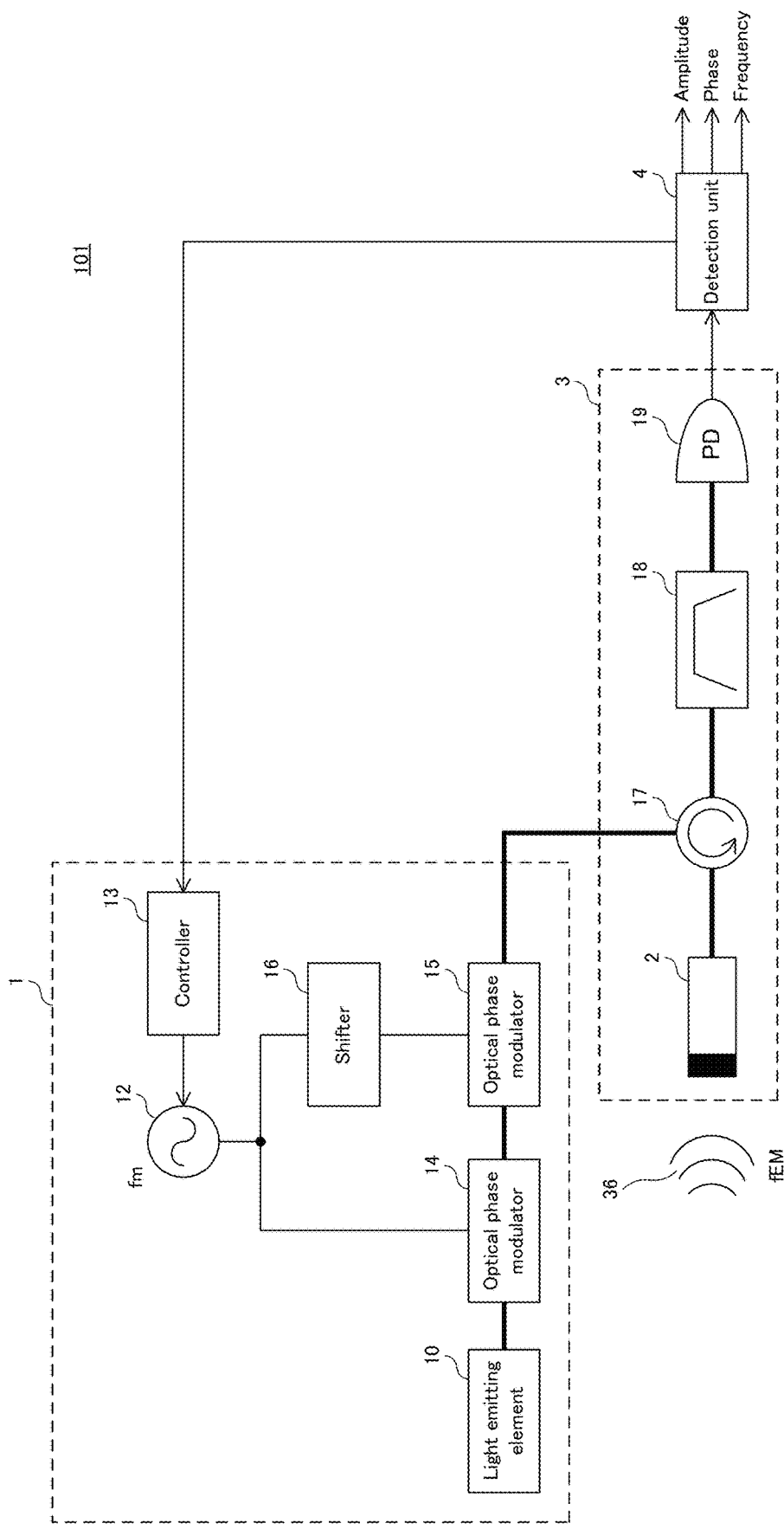
FIG. 13 is a diagram showing a configuration of a modification of the electromagnetic wave measurement apparatus according to the first embodiment of the present invention.

FIG. 13 is a diagram showing a configuration of a modification of the electromagnetic wave measurement apparatus according to the first embodiment of the present invention. This modification is the same as the electromagnetic wave measurement apparatus 101 shown in FIG. 9 except for the following content.

As shown in FIG. 13, the controller 13 controls the phase or frequency of the oscillation signal from the oscillator 12 such that the frequency of the IF signal detected by the detection unit 4 is constant or falls within a desired bandwidth. If this is the case, the controller 13 also serves as a phase setting unit that sets the phase of the temporal fluctuation of the frequency difference of the probe light so as to match the phase of the temporal fluctuation of the frequency of the detection target electromagnetic wave 36.

With such a configuration, it is possible to cause the probe frequency fp to follow the detection target electromagnetic wave 36. Therefore, it is possible to suppress frequency drift of the IF signal, for example.

Note that the configuration for processing the output light from the electro-optic probe 2 is not limited to a configuration that uses an optical wavelength filter as shown in FIGS. 2 and 9, and may be another configuration. For example, it is possible to employ a configuration in which probe light, which is a circular polarized wave, is subjected to polarization modulation performed by an electro-optic crystal, and is converted to intensity-modulated light by a waveplate and a polarization element such as a polarization beam splitter, and the converted light is supplied to the light receiving element.

If this is the case, as in the configuration shown in FIGS. 2 and 9, the light receiving element converts light that is based on the light output from the electro-optic probe 2, into an electric signal. The probe light generation unit 1 may also be configured to control the fluctuation of the frequency difference of the probe light based on the frequency of the electric signal converted by the light receiving element.

Also, even if specifications regarding the frequency fluctuation of the detection target electromagnetic wave 36 is unknown, it is possible to estimate specifications regarding the frequency fluctuation of the detection target electromagnetic wave 36 based on the probe frequency fp and the frequency of the IF signal. For example, the electromagnetic wave measurement apparatus 101 may be configured to set the probe frequency fp to be constant and estimate specifications regarding the frequency fluctuation of the detection target electromagnetic wave 36 based on the frequency of the IF signal detected by the detection unit 4 and the probe frequency fp.

Figure 14:
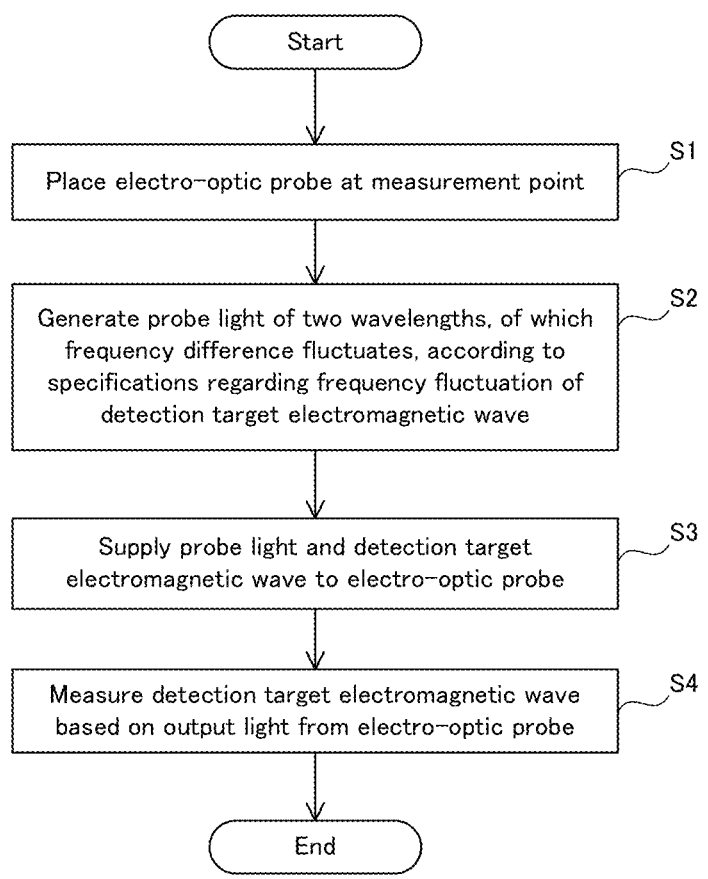
FIG. 14 is a diagram showing procedures of the electromagnetic wave measurement method that is performed using the electromagnetic wave measurement apparatus according to the first embodiment of the present invention.

FIG. 14 is a diagram showing procedures of the electromagnetic wave measurement method that is performed using the electromagnetic wave measurement apparatus according to the first embodiment of the present invention.

As shown in FIG. 14, first, the electro-optic probe 2 is placed at a measurement point in the space of the measurement target electric field (step S1).

Next, probe light of two wavelengths, of which the frequency difference fluctuates, are generated. The fluctuation of the frequency difference conforms to specifications regarding the frequency fluctuation of the detection target electromagnetic wave 36.

For example, the frequency difference of probe light is fluctuated such that the fluctuation range of the difference between the frequency difference of probe light and the frequency of the detection target electromagnetic wave 36 is smaller than the fluctuation range of the frequency of the detection target electromagnetic wave 36, e.g. the above-described frequency modulation range Δf.

Here, the phase of the temporal fluctuation of the frequency difference of probe light may be set such that the phase of the frequency difference matches the phase of the temporal fluctuation of the frequency of the detection target electromagnetic wave 36. Also, in the modification shown in FIG. 12 or 13 described above, the frequency difference of the probe light may be fluctuated so as to follow the frequency fluctuation of the detection target electromagnetic wave 36. Specifically, the fluctuation of the frequency difference of the probe light may be controlled based on the frequency of the electric signal converted by the light receiving element 19 (step S2).

Next, the generated probe light is supplied to the electro-optic probe 2, and the detection target electromagnetic wave 36 is also supplied thereto (step S3).

Next, the detection target electromagnetic wave 36 is measured based on output light from the electro-optic probe 2 (step S4).

Note that it is also possible to assume that supply of the detection target electromagnetic wave 36 to the electro-optic probe 2 starts upon the electro-optic probe 2 being placed at the above-described measurement point (step S1). In this case also, the probe light and the detection target electromagnetic wave 36 are supplied to the electro-optic probe 2 in step S3.

Meanwhile, there is a demand for a technology that is superior to the technologies disclosed in Patent Documents 1 and 2 and makes it possible to desirably measure an electromagnetic wave at low cost.

To meet this demand, the probe light generation unit 1 in the electromagnetic wave measurement apparatus according to the first embodiment of the present invention generates probe light of two wavelengths. The electro-optic probe 2 includes an electro-optic crystal, and receives the probe light generated by the probe light generation unit 1 and the detection target electromagnetic wave 36. The probe light generation unit 1 performs a fluctuation operation to cause the frequency difference of the probe light to fluctuate. This fluctuation operation is set so as to conform to specifications regarding the frequency fluctuation of the detection target electromagnetic wave 36, i.e. the predetermined frequency fluctuation of the detection target electromagnetic wave 36.

As described above, with the configuration for fluctuating the probe frequency fp in conformity with the specifications of the detection target electromagnetic wave 36, it is possible to reduce the frequency fluctuation of the electric signal that is based on the output light from the electro-optic probe 2. As a result, it is possible to significantly reduce the bandwidth that is required for a circuit that processes the electric signal, compared to the occupied bandwidth of the detection target electromagnetic wave 36, for example. Thus, it is possible to perform measurement that is advantageous in terms of the SN ratio, and it is possible to significantly reduce costs involved in the manufacturing of the circuit.

Therefore, the electromagnetic wave measurement apparatus according to the first embodiment of the present invention can desirably measure an electromagnetic wave at low cost, using an electro-optic crystal.

Specifically, the electromagnetic wave measurement apparatus 101 can convert a wide band signal into a narrow-band, low-frequency signal, using an optical technology. Thus, it is possible to accurately measure an electromagnetic wave with known frequency fluctuation or estimated frequency fluctuation, such as the electric field of a FM-CW radar, using a low-cost, low-speed signal processing circuit or the like.

Also, in the electromagnetic wave measurement apparatus according to the first embodiment of the present invention, the probe light generation unit 1 causes the frequency difference of probe light to fluctuate, through the fluctuation operation, such that the fluctuation range of the difference between the frequency difference of probe light and the frequency of the detection target electromagnetic wave 36 is smaller than the fluctuation range of the frequency of the detection target electromagnetic wave 36.

With the above-described configuration, it is possible to appropriately cause the probe frequency fp to fluctuate, and significantly reduce the bandwidth that is required for a circuit that processes the electric signal that is based on the output light from the electro-optic probe 2, compared to the occupied bandwidth of the detection target electromagnetic wave 36, for example.

Also, in the electromagnetic wave measurement apparatus according to the first embodiment of the present invention, the probe light generation unit 1 causes the frequency difference of probe light to fluctuate, through the fluctuation operation, such that the frequency difference follows the frequency fluctuation of the detection target electromagnetic wave 36.

Thus, with the configuration for causing the probe frequency fp to follow the detection target electromagnetic wave 36, it is possible to easily reduce the frequency fluctuation of the electric signal that is based on the output light from the electro-optic probe 2.

Also, in the electromagnetic wave measurement apparatus according to the first embodiment of the present invention, the light receiving element 19 converts light that is based on the light output from the electro-optic probe 2, into an electric signal. The probe light generation unit 1 controls the fluctuation of the frequency difference of the probe light based on the frequency of the electric signal converted by the light receiving element 19.

With such a configuration, it is possible to cause the probe frequency fp to follow the detection target electromagnetic wave 36. Therefore, it is possible to suppress frequency drift of the IF signal, for example, and obtain more stable measurement results.

Also, in the electromagnetic wave measurement apparatus according to the first embodiment of the present invention, the optical wavelength filter 18 receives light output from the electro-optic probe 2. The light receiving element 19 converts light that has passed through the optical wavelength filter 18, into an electric signal. The band of the optical wavelength filter 18 does not include one of the frequencies of the probe light.

With such a configuration, it is possible to remove unnecessary components from the output light from the electro-optic probe 2, and obtain stable measurement results, while allowing specifications regarding the frequency fluctuation of the detection target electromagnetic wave 36. Also, it is possible to appropriately set the band of the optical wavelength filter, which is generally difficult to narrow, without setting it to be unnecessarily narrow. Therefore, it is possible to easily use the optical wavelength filter at low cost.

Also, in the electromagnetic wave measurement apparatus according to the first embodiment of the present invention, the polarization element receives light output from the electro-optic probe 2. The light receiving element 19 converts light that has passed through the polarization element, into an electric signal.

With such a configuration, it is possible to remove unnecessary components from the output light from the electro-optic probe 2, and obtain stable measurement results, while allowing specifications regarding the frequency fluctuation of the detection target electromagnetic wave 36.

Also, with the electromagnetic wave measurement method according to the first embodiment of the present invention, first, probe light of two wavelengths are generated. Next, the generated probe light is supplied to the electro-optic probe 2 that includes an electro-optic crystal, and the detection target electromagnetic wave 36 is also supplied thereto. Thereafter, when probe light is to be generated, a fluctuation operation is performed to cause the frequency difference of the probe light to fluctuate. This fluctuation operation conforms to specifications regarding the frequency fluctuation of the detection target electromagnetic wave 36.

As described above, with the method through which the probe frequency fp is fluctuated in conformity with the specifications of the detection target electromagnetic wave 36, it is possible to reduce the frequency fluctuation of the electric signal that is based on the output light from the electro-optic probe 2. As a result, it is possible to significantly reduce the bandwidth that is required for a circuit that processes the electric signal, compared to the occupied bandwidth of the detection target electromagnetic wave 36, for example. Thus, it is possible to perform measurement that is advantageous in terms of the SN ratio, and it is possible to significantly reduce costs involved in the manufacturing of the circuit.

Therefore, with the electromagnetic wave measurement method according to the first embodiment of the present invention, it is possible to desirably measure an electromagnetic wave at low cost, using an electro-optic crystal.

Specifically, with the electromagnetic wave measurement method according to the first embodiment of the present invention, it is possible to convert a wide band signal into a narrow-band, low-frequency signal, using an optical technology. Thus, it is possible to accurately measure an electromagnetic wave with known frequency fluctuation or estimated frequency fluctuation, such as the electric field of a FM-CW radar, using a low-cost, low-speed signal processing circuit or the like.

The following will describe another embodiment of the present invention with reference to the drawings. Note that, in the drawings, the same reference numerals are given to the same or corresponding components in the drawings, and redundant descriptions thereof are not repeated.

Second Embodiment

The present embodiment relates to an electromagnetic wave measurement apparatus that uses a plurality of electro-optic probes in contrast to the electromagnetic wave measurement apparatus according to the first embodiment. This electromagnetic wave measurement apparatus is the same as the electromagnetic wave measurement apparatus according to the first embodiment except for the features described below.

Figure 15:
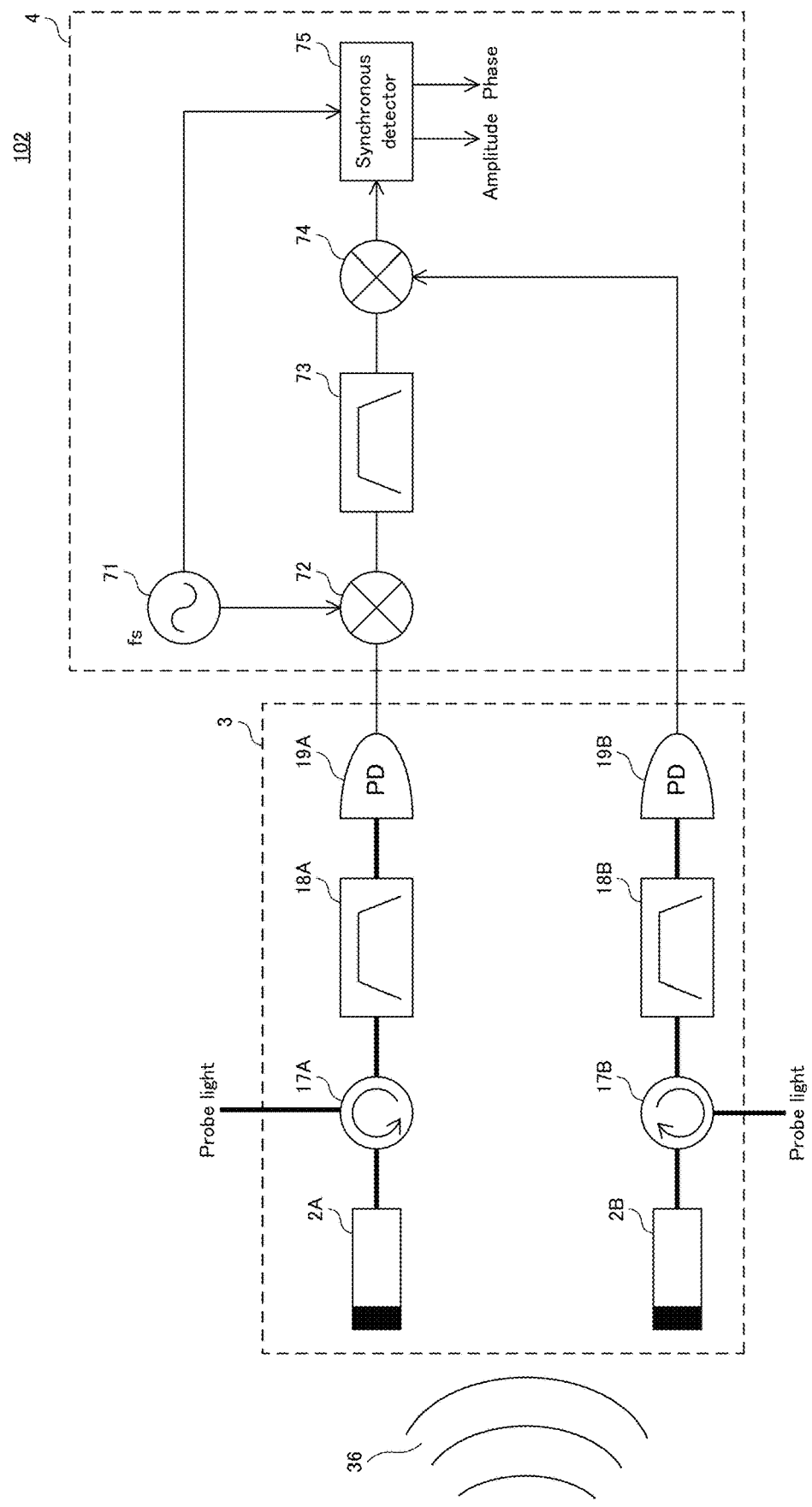
FIG. 15 is a diagram showing a configuration of the electromagnetic wave measurement apparatus according to the second embodiment of the present invention.

FIG. 15 is a diagram showing a configuration of the electromagnetic wave measurement apparatus according to the second embodiment of the present invention.

As shown in FIG. 15, an electromagnetic wave measurement apparatus 102 includes the probe light generation unit 1 (not shown), the frequency conversion unit 3, and the detection unit 4. The frequency conversion unit 3 includes electro-optic probes 2A and 2B, which are the same as the electro-optic probe 2, circulators 17A and 17B, which are the same as the circulator 17, optical wavelength filters 18A and 18B, which are the same as the optical wavelength filter 18, and light receiving elements (PD) 19A and 19B, which are the same as the light receiving element 19. The detection unit 4 includes an oscillator 71, mixers 72 and 74, a filter 73, and a synchronous detector 75.

The electro-optic probe 2A is placed at a measurement point in the space of the measurement target electric field. The measurement point is a predetermined spatial position for measuring spatial distribution regarding the measurement target electric field, and is a grid point in a one-, two- or three-dimensional mesh, for example.

The electro-optic probe 2B is fixed at a reference point in the space of the measurement target electric field. The reference point is a position for detecting a phase that serves as a reference for the phase of the measurement target electric field at the measurement point, and may be any point in the space of the measurement target electric field.

For example, each electro-optic probe 2 receives the same probe light from the probe light generation unit 1.

More specifically, the probe light that has been transmitted from the probe light generation unit 1 to the electro-optic probes 2 via the circulators 17 interacts with the detection target electromagnetic wave 36 in the electro-optic probes 2, and is reflected and output to the circulators 17, and is thereafter output from the circulators 17 to the optical wavelength filters 18.

For example, the circulators 17A and 17B receive rays of probe light of the frequencies f1 and f2 from the probe light generation unit 1, and outputs the rays of probe light to the electro-optic probe 2. Note that fEM≠f2−f1 is satisfied, where fEM denotes the frequency of the detection target electromagnetic wave 36. As described above, these light rays may be two light rays that have been asynchronously generated, or components of an optical frequency comb.

In the electro-optic probe 2, the detection target electromagnetic wave 36 of the frequency fEM and the light from the circulators 17 interact with each other, and thus sideband components of the frequency f1+fEM and the frequency f1−fEM, and sideband components of the frequency f2+fEM and the frequency f2−fEM are generated.

The optical wavelength filters 18 attenuate frequency components that are not in a predetermined frequency band, of the frequency components of the light received from circulators 17, for example. More specifically, the optical wavelength filters 18 are band pass filters that select a light ray in a single sideband and one of the light rays received by the circulators 17 from the probe light generation unit 1, from the light received by the circulators 17. In this example, the optical wavelength filter 18 outputs light of the frequency f1+fEM and light of the frequency f2.

The light receiving element 19A converts light that has passed through the optical wavelength filter 18A, into an electric signal, and outputs the electric signal to the mixer 72. The light receiving element 19B converts light that has passed through the optical wavelength filter 18B, into an electric signal, and outputs the electric signal to the mixer 74. More specifically, the light receiving element 19 performs photoelectric conversion (O/E), and an electric signal in the IF band of the frequency f2−f1−fEM is obtained, for example.

The detection unit 4 detects the phase difference between the electric signals converted by the light receiving elements 19A and 19B.

More specifically, the oscillator 71 generates a reference signal, which is an oscillation signal of the frequency fs, and outputs the reference signal to the mixer 72 and the synchronous detector 75.

The mixer 72 multiplies the IF signal received from the light receiving element 19A by the reference signal received from the oscillator 71 to output electric signals that have the frequency that is equal to the sum of the frequency f2−f1−fEM and the frequency fs and the frequency that is equal to the difference between them.

The filter 73 attenuates frequency components that are not in a predetermined frequency band, of the frequency components of the electric signal received from the mixer 72, for example. More specifically, the filter 73 is a band pass filter or a lowpass filter that selects a frequency component corresponding to the sum of the frequency f2−f1−fEM and the frequency fs or the difference between them, of the frequency components of the electric signal received from the mixer 72, for example. In this example, the filter 73 outputs an electric signal that has a frequency component of the aforementioned difference frequency (f2−f1−fEM−fs).

The mixer 74 multiplies the electric signal received from the filter 73 by the IF signal received from the light receiving element 19B to output an electric signal that have the frequency that is equal to the sum of the frequency f2−f1−fEM−fs and the frequency f2−f1−fEM and the frequency that is equal to the difference between them.

The synchronous detector 75 is an example of a detector that measures the detection target electromagnetic wave 36. The synchronous detector 75 is a circuit that extracts a signal component that is synchronized with the reference signal received from the oscillator 71, i.e. a signal component that has the frequency fs, from the electric signal received from the mixer 74. The synchronous detector 75 is, for example, a lock-in amplifier to which the signal output from the mixer 74 is input, and that extracts only a signal component that is synchronized with the reference signal generated by the oscillator 71.

The signal output from the synchronous detector 75 has an amplitude and a phase of the measurement target electric field at the measurement point where the electro-optic probe 2A is placed. More specifically, the signal has a phase relative to the phase of the measurement target electric field at the reference point where the electro-optic probe 2B is placed in the measurement target electric field.

As described above, the synchronous detector 75 only extracts a signal component that has the frequency fs=fs−(f2−f1−fEM)+(f2−f1−fEM) of the reference signal, from which phase and frequency fluctuations in the measurement target electric field are cancelled out from the signal output from the mixer 74, and a signal component that depends on the frequency f2−f1−fEM is cancelled out, and thus the amplitude and phase of the measurement target electric field are specified.

Upon the measurement of the amplitude and phase at the first measurement point in the measurement target electric field being complete, the electro-optic probe 2A is subsequently moved to the second measurement point with the electro-optic probe 2B being fixed at the reference point, and the amplitude and phase at the second measurement point are measured through the above-described signal processing. Such measurement is performed at all of the predetermined measurement points.

Figure 16:
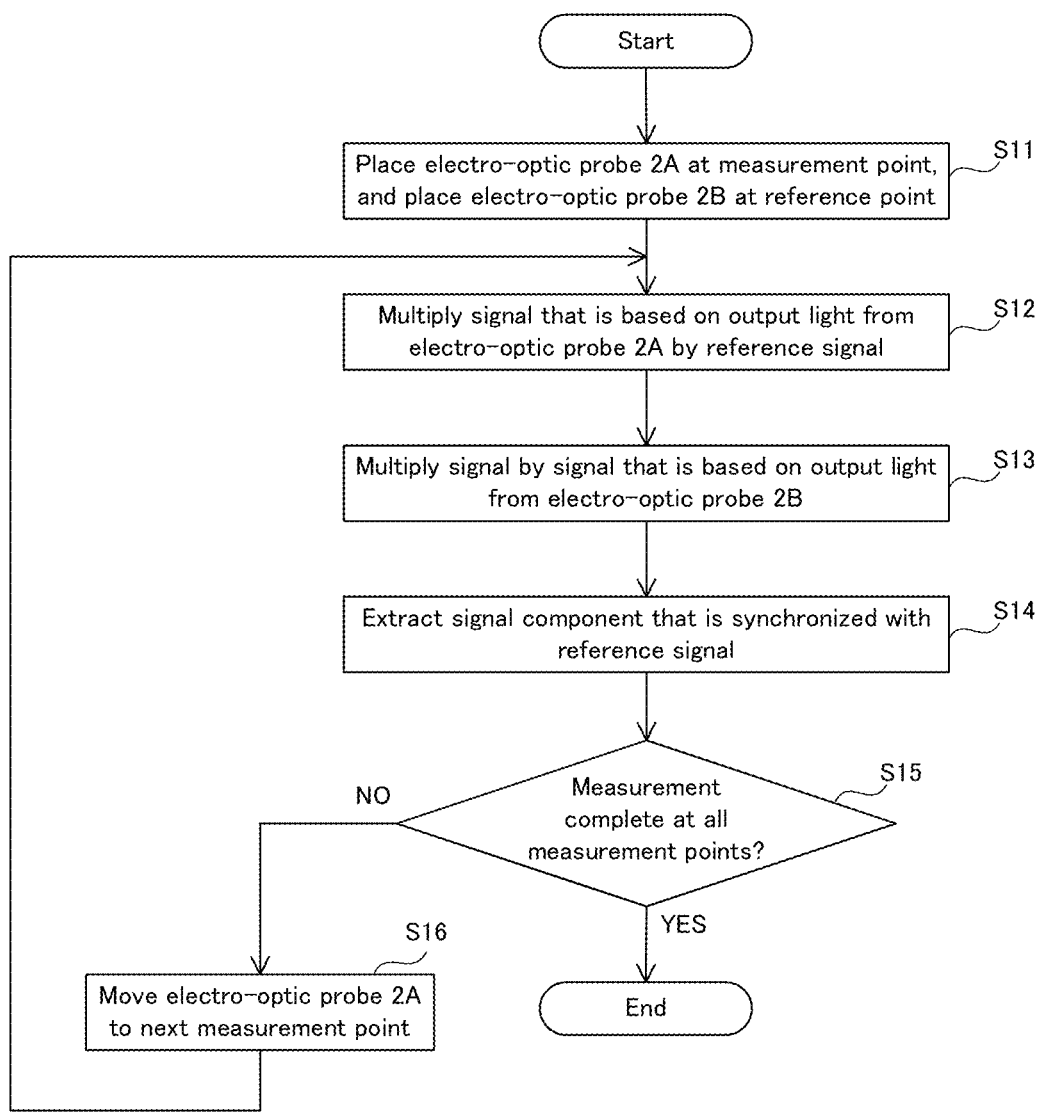
FIG. 16 is a diagram showing procedures of an electromagnetic wave measurement method that is performed using the electromagnetic wave measurement apparatus according to the second embodiment of the present invention.

FIG. 16 is a diagram showing procedures of an electromagnetic wave measurement method that is performed using the electromagnetic wave measurement apparatus according to the second embodiment of the present invention.

As shown in FIG. 16, first, the electro-optic probe 2A is placed at a measurement point in the space of the measurement target electric field, and the electro-optic probe 2B is placed at the reference point (step S11).

Next, using the mixer 72, a signal that is based on the light output from the electro-optic probe 2A, i.e. a signal output from the light receiving element 19A is multiplied, by the reference signal output from the oscillator 71 (step S12).

Next, using the mixer 74, the signal output from the mixer 72 is multiplied by a signal that is based on the light output from the electro-optic probe 2B, i.e. the signal output from the light receiving element 19B (step S13).

Next, using the synchronous detector 75, a signal component that is synchronized with the reference signal generated by the oscillator 71 is extracted from the signal output from the mixer 74 (step S14). Thus, the amplitude and phase of the measurement target electric field at the measurement point can be obtained.

Next, if measurement has not been completed at all of the predetermined measurement points (NO in step S15), the electro-optic probe 2A is moved to the next measurement point (step S16) and the same signal processing is performed (steps S12 to S14).

On the other hand, if measurement has been completed at all of the predetermined measurement points (YES in step S15), measurement is terminated. Thus, spatial distribution regarding the measurement target electric field can be obtained.

Although the detection unit 4 in the electromagnetic wave measurement apparatus according to the second embodiment of the present invention is configured to measure the amplitude and phase of the detection target electromagnetic wave 36, the present invention is not limited to such a configuration. The detection unit 4 may be configured to measure one of the amplitude and phase of the detection target electromagnetic wave 36.

Also, although the detection unit 4 in the electromagnetic wave measurement apparatus according to the second embodiment of the present invention is configured to perform analog signal processing, the present invention is not limited to such a configuration. The detection unit 4 may be configured to perform digital signal processing.

For example, the detection unit 4 may be configured to convert IF signals to digital signals, using an A/D converter, obtain the phase thereof by performing a Fourier transform operation, and obtain the phase difference. If this is the case, in the modifications shown in FIGS. 12 and 13, the phase of the frequency waveform of the output light from the light emitting element 22 or the frequency of the output light, and the phase or the frequency of the oscillation signal from the oscillator 12 can be controlled such that the frequency obtained through the Fourier transform operation is constant or falls within a desired bandwidth.

Also, the configuration for processing the output light from the electro-optic probes 2A and 2B is not limited to a configuration that uses an optical wavelength filter as shown in FIG. 15, and may be another configuration. For example, it is possible to employ a configuration in which probe light, which is a circular polarized wave, is subjected to polarization modulation performed by an electro-optic crystal, and is converted to intensity-modulated light by a waveplate and a polarization element such as a polarization beam splitter, and the converted light is supplied to the light receiving element.

Test 1

The inventors of the present invention performed the following tests, using the electromagnetic wave measurement apparatus 102.

Figure 17:
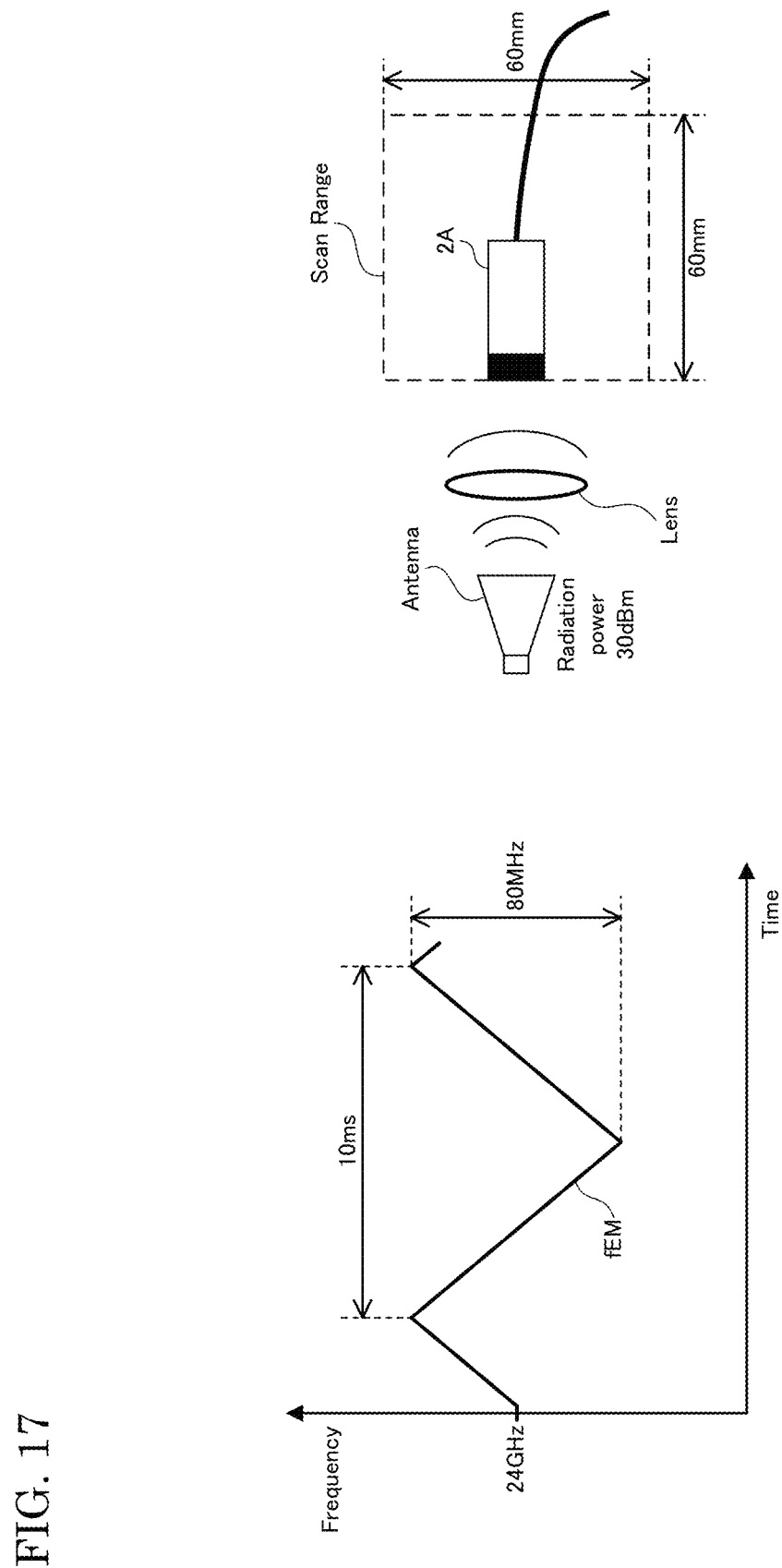
FIG. 17 is a diagram showing an example of a measurement system using the electromagnetic wave measurement apparatus according to the second embodiment of the present invention.

FIG. 17 is a diagram showing an example of a measurement system using the electromagnetic wave measurement apparatus according to the second embodiment of the present invention.

As shown in FIG. 17, asynchronous measurement was performed in this test, where the detection target electromagnetic wave 36 and the probe light were not synchronization with each other. For example, the detection target electromagnetic wave 36 of the frequency fEM that conforms to the FM-CW system was generated using a VCO, and the detection target electromagnetic wave 36 was radiated from an antenna such as a horn antenna to the electro-optic probe 2.

The center frequency, the frequency modulation range, the period, and the radiative power of the detection target electromagnetic wave 36 were respectively 24 GHz, 80 MHz, 10 ms, and 30 dBm.

In this test, the configuration shown in FIG. 9 was employed for the electromagnetic wave measurement apparatus 102, and two components of the optical frequency comb shown in FIG. 10 were used as probe light.

More specifically, the oscillation signal supplied from the oscillator 12 to the optical phase modulators 14 and 15 was a sine wave with a center frequency of 12.0033 GHz. Then, the oscillation signal from the oscillator 12 was modulated so as to be a triangular wave, and probe light was generated such that the frequency difference thereof fluctuated with a period of 10 ms and a frequency modulation range of 80 MHz. Also, the obtained IF signal was measured and the initial phase of the oscillation signal from the oscillator 12 was controlled such that the frequency fluctuation range of the IF signal fell within a predetermined width. Such generation of probe light corresponds to step S2 shown in FIG. 14, for example. Here, the frequency of the obtained IF signal was 6.6 MHz. The bandwidth of the signal processing circuit corresponding to the detection unit 4 was 5 MHz.

The range of scanning performed by the electro-optic probe 2A, i.e. the range of the measurement point, was a 60 mm square.

Figure 18:
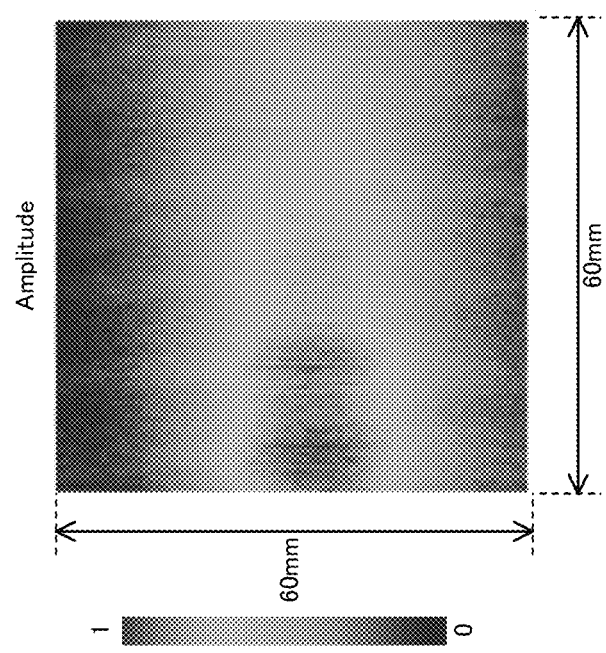
FIG. 18 is a diagram showing an example of a result of measurement performed by the electromagnetic wave measurement apparatus according to the second embodiment of the present invention.
Figure 19:
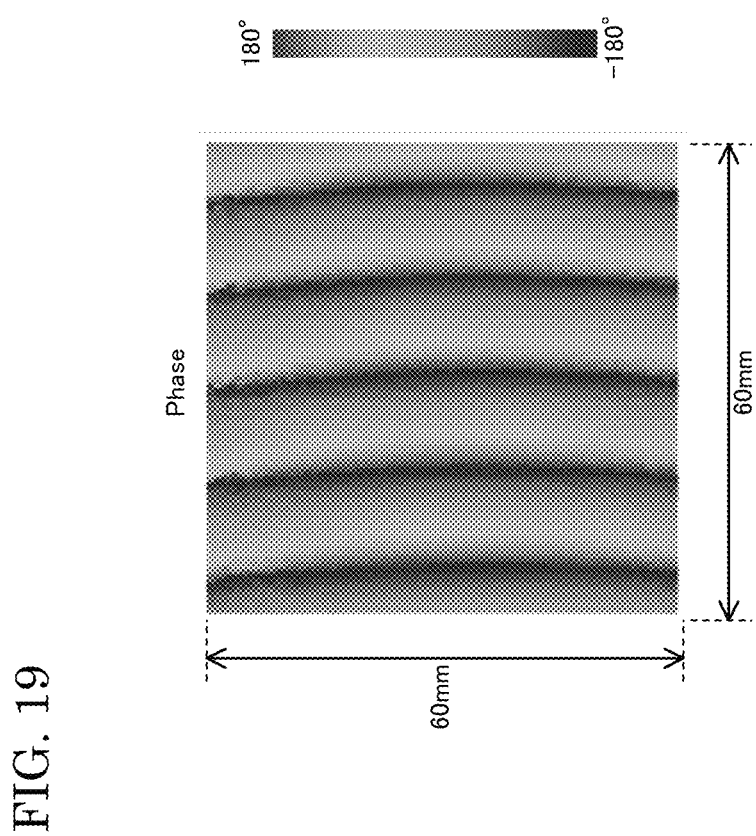
FIG. 19 is a diagram showing an example of a result of measurement performed by the electromagnetic wave measurement apparatus according to the second embodiment of the present invention.

FIGS. 18 and 19 are diagrams showing examples of results of measurement performed by the electromagnetic wave measurement apparatus according to the second embodiment of the present invention.

While the detection target electromagnetic wave 36 and the probe light are not synchronized with each other, the frequency difference of the probe light is fluctuated according to specifications regarding the frequency fluctuation of the detection target electromagnetic wave 36, and thus the frequency fluctuation of the IF signal can be reduced.

Also, the relative frequency fluctuation of the detection target electromagnetic wave 36 and the probe light, i.e. the phase fluctuation was cancelled out by the signal processing circuit with a bandwidth of 5 MHz, and as a result, the spatial distribution of the amplitude and the phase was visualized, as shown in FIGS. 18 and 19.

This is because the SN ratio was kept at a high level as a result of a signal processing circuit with a narrow bandwidth being used. When the frequency difference of the probe light was not fluctuated, the spatial distribution could not be visualized.

The frequency of the probe light and the fluctuation range of the frequency can be easily set using an electric signal, for example. Therefore, the electromagnetic wave measurement apparatus 102 can be easily applied to the above-described 79 GHz-band FM-CW radar with an occupied bandwidth of 4 GHz, for example.

Figure 20:
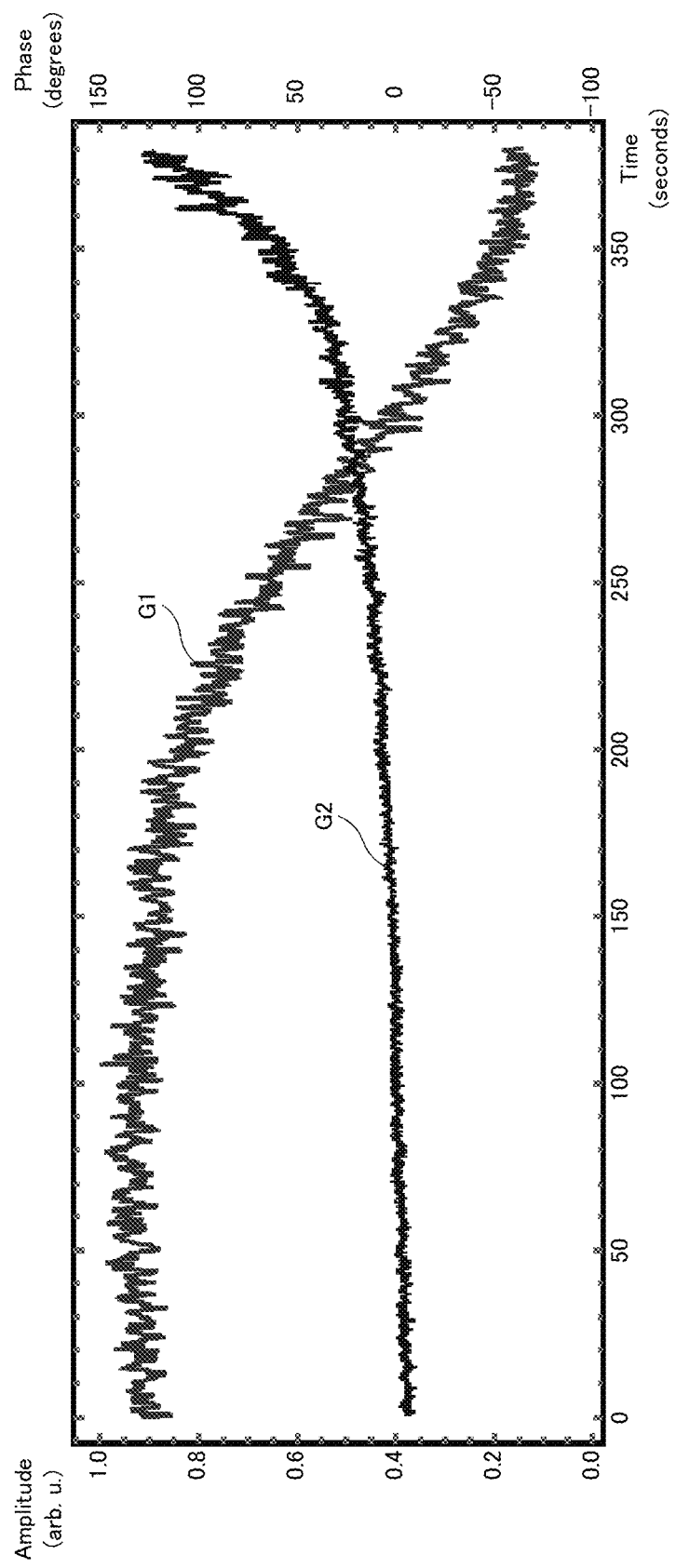
FIG. 20 is a diagram showing an example of a result of measurement performed by the electromagnetic wave measurement apparatus according to the second embodiment of the present invention.

FIG. 20 is a diagram showing an example of a result of measurement performed by the electromagnetic wave measurement apparatus according to the second embodiment of the present invention.

In FIG. 20, the vertical axis indicates the amplitude (arb. u.) and the phase (degrees), and the horizontal axis indicates time (seconds). The amplitude indicated by the vertical axis takes a normalized value. A graph-line G1 indicates the amplitude and a graph-line G2 indicates the phase.

As shown in FIG. 20, almost constant amplitude and phase were measured until approximately 150 seconds had elapsed from the start of measurement.

Thereafter, the difference between the frequency of the detection target electromagnetic wave 36 and the frequency of the probe light increased, and amplitude attenuation and phasing occurred due to the filter 73.

Therefore, it is preferable to employ a configuration for fluctuating the frequency difference of the probe light so as to follow the frequency fluctuation of the detection target electromagnetic wave 36. Specifically, it is preferable to employ a configuration for controlling fluctuation of the frequency difference of the probe light based on the frequency of the electric signal converted by the light receiving element 19, as shown in FIGS. 12 and 13.

However, the present invention is not limited to such a configuration. If the period of time during which almost constant amplitude and phase can be obtained, which is 150 seconds in this example, is sufficient relative to specifications regarding measurement or the like, it is unnecessary to employ the configuration shown in FIGS. 12 and 13.

Test 2

The inventors of the present invention also performed a test using an electromagnetic wave measurement apparatus that uses an optical frequency comb and a configuration for subjecting the phase or the frequency of the oscillator 12 to feedback control shown in FIG. 13, and uses the configuration shown in FIG. 15, in which the electro-optic probes 2A and 2B are used.

In this test, asynchronous measurement is performed, where the detection target electromagnetic wave 36 and the probe light are not synchronized with each other. For example, a detection target electromagnetic wave 36 of the frequency fEM that conforms to the FM-CW system was generated using a synthesizer, was subjected to branching, using a directional coupler, and was thereafter emitted toward the electro-optic probes 2A and 2B. The detection target electromagnetic wave 36 that underwent branching was emitted toward the electro-optic probe 2A from a horn antenna. The electro-optic probe 2A was placed at approximately 15 mm from the opening of the horn antenna. The range of scanning performed by the electro-optic probe 2A, i.e. the range of the measurement point, was a 70 mm square.

The center frequency, the frequency modulation range, and the period of the detection target electromagnetic wave 36 were respectively 24 GHz, 160 MHz, and 2.5 ms, and the radiative power of the detection target electromagnetic wave 36 directed toward the directional coupler was 230 mW. The oscillation signal supplied from the oscillator 12 to the optical phase modulators 14 and 15 was a sine wave with a center frequency of 12.0018 GHz, the frequency fs was 1.7 MHz, the passband of the filter 73 was from 5 MHz to 6 MHz, and the time constant of the lock-in amplifier was 100 ms. The controller 13 performed PI control where the target value of the frequency of the IF signal was 3.6 MHz.

Figure 21:
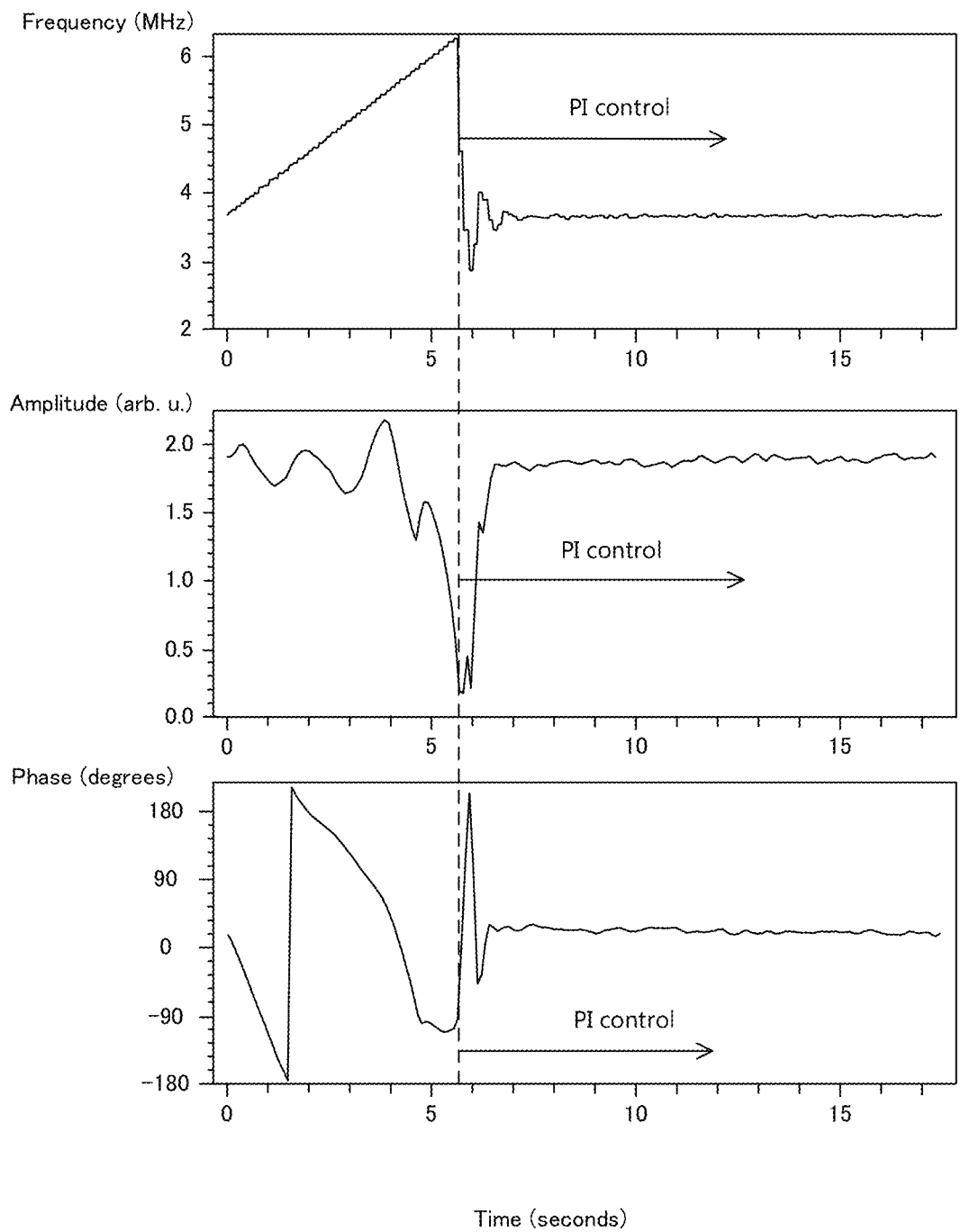
FIG. 21 is a diagram showing another example of a result of measurement performed by the electromagnetic wave measurement apparatus according to the second embodiment of the present invention.

FIG. 21 is a diagram showing another example of a result of measurement performed by the electromagnetic wave measurement apparatus according to the second embodiment of the present invention.

In the upper graph shown in FIG. 21, the vertical axis indicates the frequency (MHz) and the horizontal axis indicates time (seconds). In the graph shown in the middle of FIG. 21, the vertical axis indicates the amplitude (arb. u.), and the horizontal axis indicates time (seconds). The amplitude indicated by the vertical axis takes a normalized value. In the lower graph shown in FIG. 21, the vertical axis indicates the phase (degrees), and the horizontal axis indicates time (seconds).

As shown in FIG. 21, PI control was started when approximately five seconds had elapsed from the start of measurement. While PI control was being not performed, the difference between the frequency of the detection target electromagnetic wave 36 and the frequency of the probe light increased, and the amplitude and the phase significantly changed along with the frequency drift of 150 kHz/sec of the IF signal. As a result, the amplitude and the phase could not be accurately measured.

Thereafter, upon PI control being started, the frequency of the IF signal was fixed at 3.6 MHz despite the initial frequency shift, and the amplitude and phase could be accurately measured. The frequency of the IF signal was controlled so as to fall within the range from the target value 3.6 MHz to the residual deviation 2.1 kHz, and a preferable result of measurement was obtained.

Figure 22:
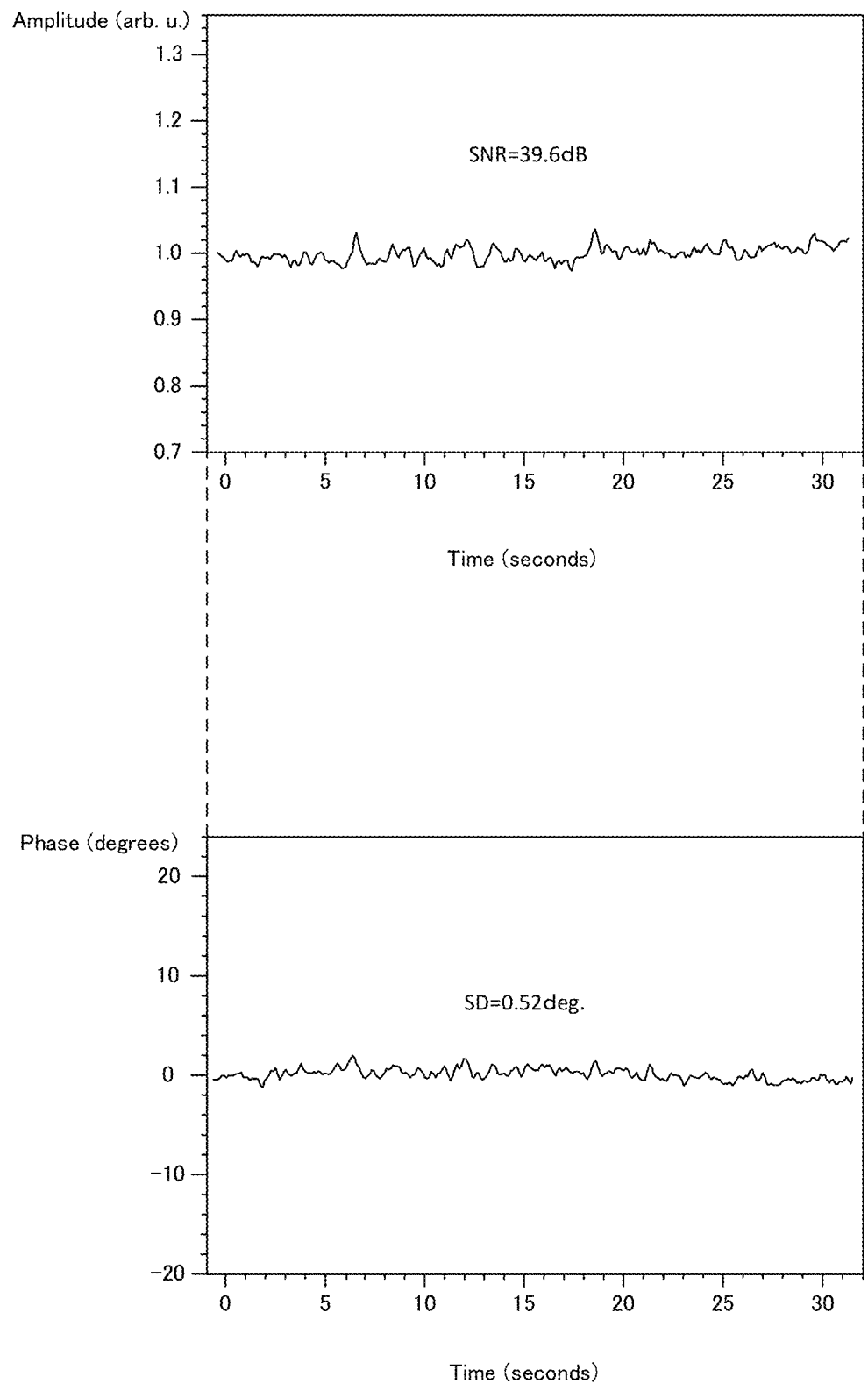
FIG. 22 is a diagram showing another example of a result of measurement performed by the electromagnetic wave measurement apparatus according to the second embodiment of the present invention.

FIG. 22 is a diagram showing another example of a result of measurement performed by the electromagnetic wave measurement apparatus according to the second embodiment of the present invention.

In the upper graph shown in FIG. 22, the vertical axis indicates the amplitude (arb. u.), and the horizontal axis indicates time (minutes). The amplitude indicated by the vertical axis takes a normalized value. In the lower graph shown in FIG. 22, the vertical axis indicates the phase (degrees), and the horizontal axis indicates time (seconds).

As shown in FIG. 22, it was confirmed through measurement of the detection target electromagnetic wave 36 that, although the residual deviation was 2.1 kHz, an SNR (Signal to Noise Ratio) of 39.6 dB was obtained through amplitude measurement and a deviation of 0.52 degrees was obtained through phase measurement, and such a stable result continued for three hours or longer.

Figure 23:
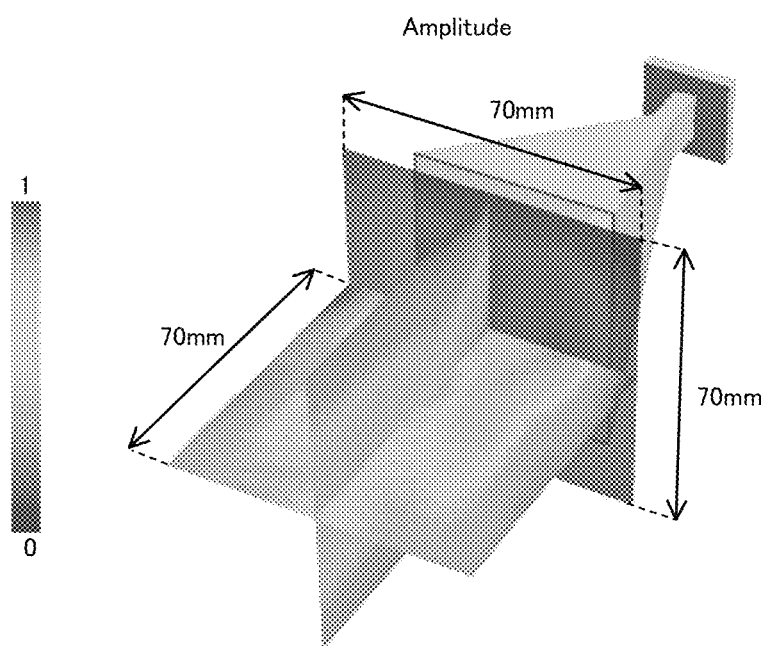
FIG. 23 is a diagram showing another example of a result of measurement performed by the electromagnetic wave measurement apparatus according to the second embodiment of the present invention.
Figure 24:
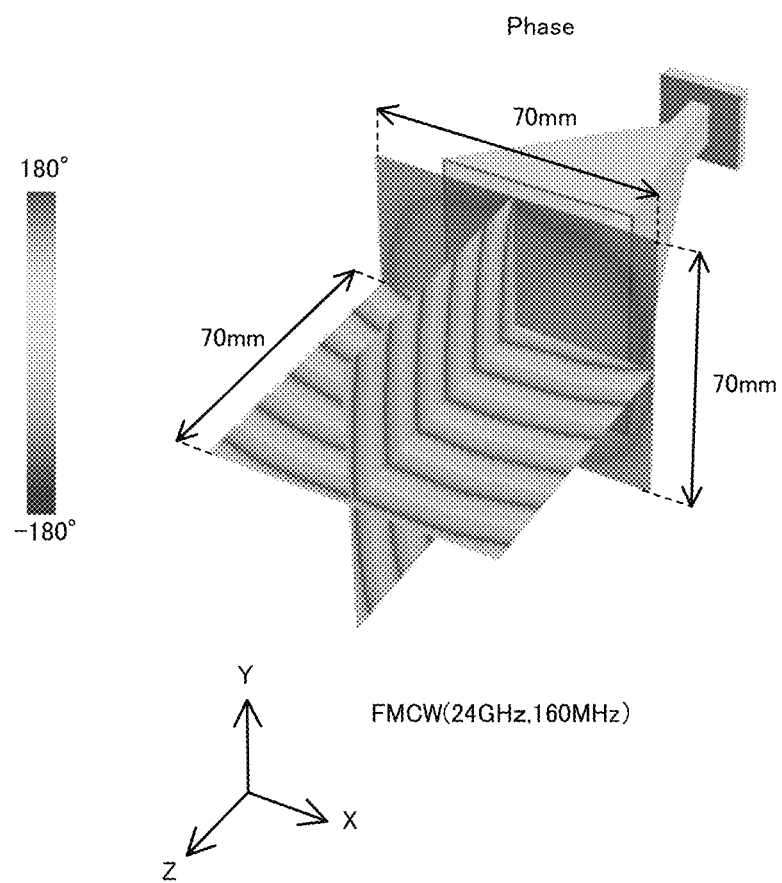
FIG. 24 is a diagram showing another example of a result of measurement performed by the electromagnetic wave measurement apparatus according to the second embodiment of the present invention.
Figure 25:
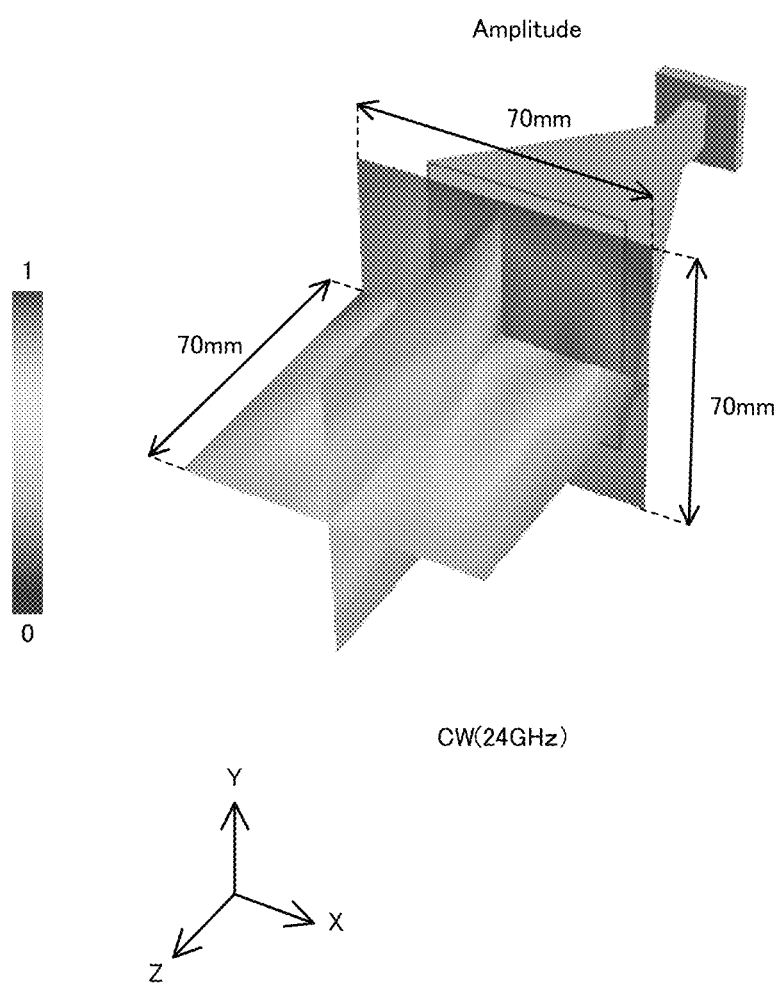
FIG. 25 is a diagram showing a result of simulation of the detection target electromagnetic wave regarding the electromagnetic wave measurement apparatus according to the second embodiment of the present invention.
Figure 26:
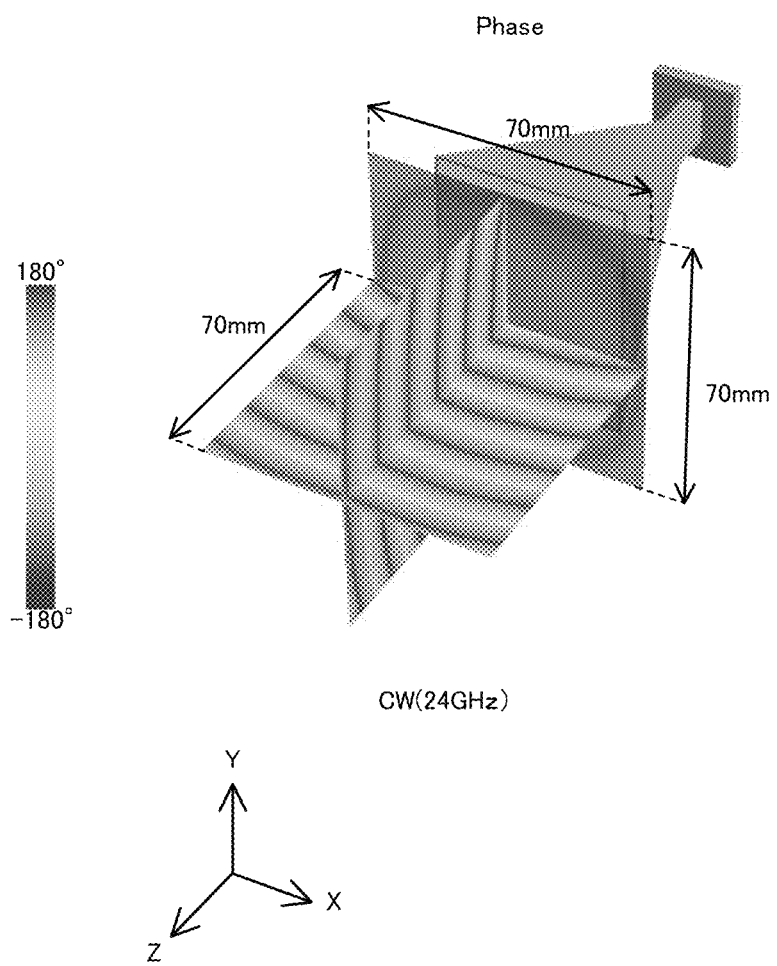
FIG. 26 is a diagram showing a result of simulation of the detection target electromagnetic wave regarding the electromagnetic wave measurement apparatus according to the second embodiment of the present invention.

FIGS. 23 and 24 are diagrams showing other examples of results of measurement performed by the electromagnetic wave measurement apparatus according to the second embodiment of the present invention. FIGS. 25 and 26 are diagrams showing results of simulation of the detection target electromagnetic wave regarding the electromagnetic wave measurement apparatus according to the second embodiment of the present invention.

FIGS. 23 and 25 respectively show results of measurement of the spatial distribution of the amplitude and phase of the measurement target radiated from a horn antenna. FIGS. 24 and 26 respectively show results of simulation of the spatial distribution of the amplitude and phase of the measurement target radiated from a horn antenna. The measurement target in FIGS. 23 and 25 is the detection target electromagnetic wave 36, and the measurement target in FIGS. 24 and 26 is the CW of 24 GHz.

As shown in FIGS. 23 and 25, imaging of three surfaces XY, XZ, and YZ was performed in the vicinity of the horn antenna, using the result of detection performed by the detection unit 4. It took approximately 30 minutes for each surface.

The spatial distribution of the amplitude and phase of the detection target electromagnetic wave 36 shown in FIGS. 23 and 25 closely matches the result of simulation shown in FIGS. 24 and 26, and it is shown that high measurement accuracy was achieved.

Figure 27:
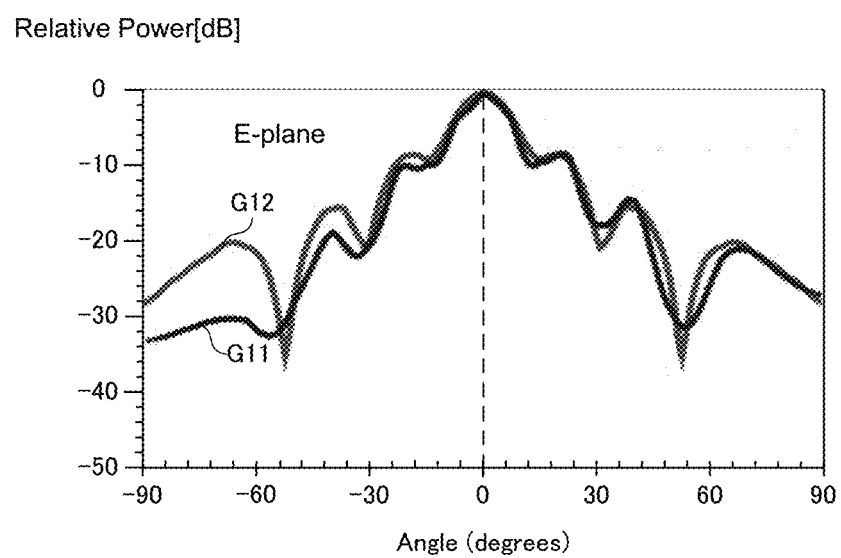
FIG. 27 is a diagram showing another example of a result of measurement and a result of simulation regarding the electromagnetic wave measurement apparatus according to the second embodiment of the present invention.
Figure 28:
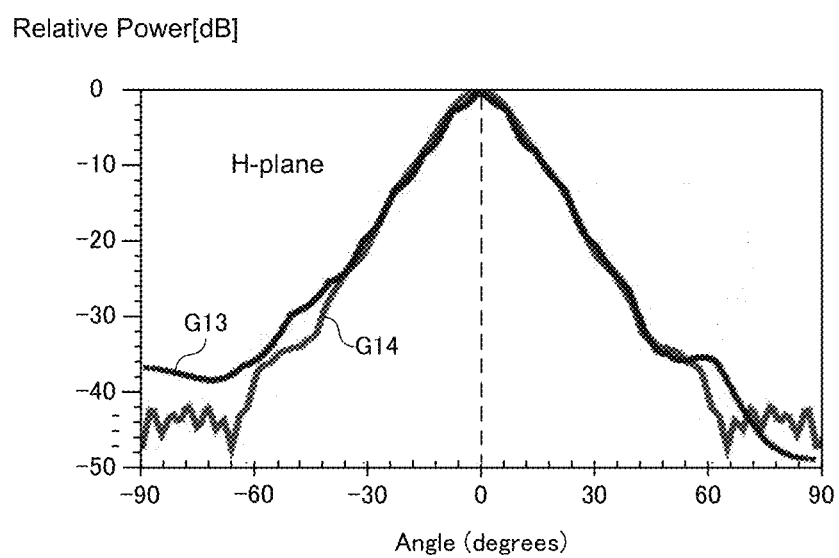
FIG. 28 is a diagram showing another example of a result of measurement and a result of simulation regarding the electromagnetic wave measurement apparatus according to the second embodiment of the present invention.

FIGS. 27 and 28 show other examples of results of measurement and results of simulation regarding the electromagnetic wave measurement apparatus according to the second embodiment of the present invention. FIGS. 27 and 28 show radiation patterns on the E surface and the H surface in the far field obtained from the results of measurement in the near field. The E surface and the H surface are parallel with the aforementioned XZ surface and the aforementioned YZ surface, respectively.

In FIG. 27, a graph-line G11 shows the result of measurement of the detection target electromagnetic wave 36, and a graph-line G12 shows the result of simulation of the CW. In FIG. 28, a graph-line G13 shows the result of measurement of the detection target electromagnetic wave 36, and a graph-line G14 shows the result of simulation of the CW.

The radiation patterns of the horn antenna, indicated by the graph-lines G11 and G13, closely match the results of simulation indicated by the graph-lines G12 and G14, and it is shown that high measurement accuracy was achieved.

As described above, the electromagnetic wave measurement apparatus according to the second embodiment of the present invention includes a plurality of electro-optic probes 2. Each electro-optic probe 2 receives the same probe light from the probe light generation unit 1.

With such a configuration, fluctuation, caused by the probe light, of the electric signals that are based on the output light from the electro-optic probes 2 can be made the same as each other. Therefore, it is possible to easily remove the fluctuation, using the detection unit 4, for example.

The electromagnetic wave measurement apparatus according to the second embodiment of the present invention includes a plurality of electro-optic probes 2. A plurality of optical wavelength filters 18 or polarization elements are provided in correspondence with the electro-optic probes 2, and each receive light output from the electro-optic probe 2 corresponding thereto. A plurality of light receiving elements 19 are provided in correspondence with the optical wavelength filters 18 or the polarization elements, and each convert light that has passed through the optical wavelength filter 18 or the polarization element corresponding thereto, into an electric signal. The detection unit 4 detects the phase difference between the electric signals converted by the light receiving elements 19.

More specifically, the electro-optic probes 2A and 2B are placed in a space in order to measure an electric field. The oscillator 71 generates a reference signal. The mixer 72 multiplies the electric signal that is based on the light output from the electro-optic probe 2A, by the reference signal. The mixer 74 multiplies the signal that is based on the electric signal output from the mixer 72, by the electric signal that is based on the light output from the electro-optic probe 2B. The synchronous detector 75 extracts a signal component that is synchronized with the reference signal, from the electric signal output from the mixer 74.

Also, in the electromagnetic wave measurement method according to the second embodiment of the present invention, first, the electro-optic probes 2A and 2B are placed in a space in order to measure an electrical field. Next, the electric signal that is based on the light output from the electro-optic probe 2A is multiplied by the reference signal generated by the oscillator 71. Next, the electric signal resulting from the multiplication is multiplied by the electric signal that is based on the light output from the electro-optic probe 2B. Thereafter, a signal component that is synchronized with the reference signal generated by the oscillator 71 is extracted from the electric signal resulting from the multiplication.

As described above, by using two probes placed in a measurement target space, a plurality of electro-optic probes can be placed at different points, and the relative frequency fluctuation of the measurement target electric field and the probe light can be cancelled out. Thus, it is possible to measure the relative phase difference between the measurement target electric fields at the points where the electro-optic probes are placed. Thus, even if the frequency of the electric field in the measurement target space fluctuates, it is possible to stably and accurately measure the spatial distribution of the amplitude and phase of the radiation electric field without synchronizing the measurement target system and the measurement system with each other.

For example, even in the case of a signal of which the frequency fluctuates over a wide range, such as in the FM-CW system, it is possible to stably visualize the spatial distribution of the amplitude and phase of the electric field without synchronizing the measurement target system and the measurement system with each other. It is also possible to accurately measure the spatial distribution of the amplitude and phase, in the vicinity of a vehicle, of an electrical field radiated from a radar apparatus mounted on an actual vehicle, for example.

Although the electro-optic probe 2B is fixed and the electro-optic probe 2A is moved in the electromagnetic wave measurement method according to the second embodiment of the present invention, the present invention is not limited in this way. The relative positions of the electro-optic probes 2A and 2B may be fixed and the electro-optic probes 2A and 2B may be moved together to obtain the spatial distribution of the measurement target electric field.

Also, although two electro-optic probes 2 and components corresponding thereto are provided in the electromagnetic wave measurement apparatus according to the second embodiment of the present invention, the present invention is not limited to such a configuration. The electromagnetic wave measurement apparatus 102 may be provided with three or more electro-optic probes 2 and components corresponding thereto. With a configuration in which three electro-optic probes 2 are used, it is possible to obtain two-dimensional distribution of the measurement target electric field. With a configuration in which four electro-optic probes 2 are used, it is possible to obtain three-dimensional distribution of the measurement target electric field.

If this is the case, for example, a plurality of optical wavelength filters 18 or polarization elements are provided in correspondence with the electro-optic probes 2, and each receive light output from the electro-optic probe 2 corresponding thereto. Also, a plurality of light receiving elements 19 are provided in correspondence with the optical wavelength filters 18 or the polarization elements, and each convert light that has passed through the optical wavelength filter 18 or the polarization element corresponding thereto, into an electric signal.

Other configurations and operations are the same as those of the electromagnetic wave measurement apparatus according to the first embodiment, and therefore detailed descriptions are not repeated here.

Note that the detection unit 4 in the electromagnetic wave measurement apparatus according to the first embodiment of the present invention may be configured to measure the frequency of the detection target electromagnetic wave 36, e.g. measure the frequency fluctuation, as described above. Specifically, the detection unit 4 may be a spectrum analyzer, an oscilloscope, a frequency counter, or a personal computer.

Also, although the electromagnetic wave measurement apparatus according to the first embodiment of the present invention and the electromagnetic wave measurement apparatus according to the second embodiment of the present invention include the detection unit 4 that measures the detection target electromagnetic wave 36, the present invention is not limited to such a configuration, and an external detection unit 4 may be included instead of the detection unit 4. That is to say, the electric signal output from the light receiving element 19 shows the result of measurement of the detection target electromagnetic wave 36 performed by the electromagnetic wave measurement apparatus 101, the modifications of the electromagnetic wave measurement apparatus 101, and the electromagnetic wave measurement apparatus 102.

Also, the electromagnetic wave measurement apparatus according to the first embodiment of the present invention and the electromagnetic wave measurement apparatus according to the second embodiment of the present invention need only be configured such that the detection target electromagnetic wave 36 is supplied to the electro-optic probe 2. For example, the detection target electromagnetic wave 36 may be emitted toward the electro-optic probe 2. Alternatively, the electro-optic probe 2 may be placed in a space where an electromagnetic wave is generated, and thus the detection target electromagnetic wave 36 may be supplied to the electro-optic probe 2.

Also, the electro-optic probe disclosed in Patent Document 2 may be used as the electro-optic probe 2. For example, the electromagnetic wave measurement apparatus 101, the modifications of the electromagnetic wave measurement apparatus 101, and the electromagnetic wave measurement apparatus 102 may be provided with an optical fiber that is optically coupled to the electro-optic crystal, and a polarization direction of light from the optical fiber that enters the electro-optic crystal and a direction of a unique axis of the electro-optic crystal being set to be in line with each other.

The foregoing embodiments are to be construed in all respects as illustrative and not restrictive. The scope of the present invention is defined by the claims rather than the description above, and is intended to include all modifications within the meaning and scope of the claims and equivalents thereof.

DESCRIPTIONS OF REFERENCE NUMERALS

1 Probe light generation unit
2, 2A, 2B Electro-optic probe
3 Frequency conversion unit
4 Detection unit
36 Detection target electromagnetic wave
101, 102 Electromagnetic wave measurement apparatus
12 Oscillator
13 Controller
14, 15 Optical phase modulator
16 Shifter
17 17A, 17B Circulator
18 18A, 18B Optical wavelength filter
19 19A, 19B Light receiving element (PD)
10, 21, 22 Light emitting element
23 Optical multiplexer
24 Controller
71 Oscillator
72, 74 Mixer
73 Filter
75 Synchronous detector

The invention claimed is:

1. An electromagnetic wave measurement apparatus, comprising:
    a probe light generation unit configured to generate light rays of two wavelengths that are two light rays of different wavelength as probe light; and
    an electro-optic probe that includes an electro-optic crystal and is configured to receive the probe light generated by the probe light generation unit and a detection target electromagnetic wave, wherein the probe light generation unit is configured to perform a fluctuation operation to cause a frequency difference of the probe light to fluctuate by fluctuating frequency of at least one of the light rays of two wavelengths while the electro-optic probe is receiving the detection target electromagnetic wave, and wherein the content of the fluctuation operation is set to conform to specifications regarding frequency fluctuation of the detection target electromagnetic wave.

2. The electromagnetic wave measurement apparatus according to claim 1, wherein, through the fluctuation operation of the probe light generation unit, a fluctuation range of a difference between the frequency difference of the probe light and a frequency of the detection target electromagnetic wave is smaller than a fluctuation range of the frequency of the detection target electromagnetic wave.

3. The electromagnetic wave measurement apparatus according to claim 1, wherein, through the fluctuation operation of the probe light generation unit, the frequency difference of the probe light follows the frequency fluctuation of the detection target electromagnetic wave by fluctuating frequency of at least one of the light rays of two wavelengths while the electro-optic probe is receiving the detection target electromagnetic wave, according to the fluctuation range of the frequency of the detection target electromagnetic wave that is known or estimated by the electromagnetic wave measurement apparatus.

4. The electromagnetic wave measurement apparatus according to claim 1, further comprising a light receiving element configured to convert light that is based on light output from the electro-optic probe, into an electric signal, wherein the probe light generation unit is configured to control fluctuation of the frequency difference through the fluctuation operation, based on a frequency of the electric signal converted by the light receiving element.

5. The electromagnetic wave measurement apparatus according to claim 1, further comprising:

an optical wavelength filter configured to receive light output from the electro-optic probe; and a light receiving element configured to convert light that has passed through the optical wavelength filter, into an electric signal, wherein a band of the optical wavelength filter does not include one of the frequencies of the probe light.

6. The electromagnetic wave measurement apparatus according to any one of claim 1, further comprising:

a polarization element configured to receive light output from the electro-optic probe; and a light receiving element configured to convert light that has passed through the polarization element, into an electric signal, wherein the polarization element is configured to convert the probe light, which is a circular polarized wave, to intensity-modulated light.

7. The electromagnetic wave measurement apparatus according to claim 1, wherein the electro-optic probe is provided in a plurality, and each electro-optic probe is configured to receive the same probe light from the probe light generation unit.

8. The electromagnetic wave measurement apparatus according to claim 1, wherein the electro-optic probe is provided in a plurality, and wherein the electromagnetic wave measurement apparatus further comprises:

a plurality of optical wavelength filters or a plurality of polarization elements provided in correspondence with the electro-optic probes and each configured to receive light output from the electro-optic probe corresponding thereto;

a plurality of light receiving elements provided in correspondence with the optical wavelength filters or the polarization elements and each configured to convert light that has passed through the optical wavelength filter or the polarization element corresponding thereto, into an electric signal; and a detection unit configured to detect a phase difference between electric signals converted by the light receiving elements.

9. An electromagnetic wave measurement method comprising:

generating light rays of two wavelengths that are two light rays of different wavelength as probe light; and supplying an electro-optic probe that includes an electro-optic crystal, with the probe light thus generated and a detection target electromagnetic wave, wherein, in the generating the light rays, a fluctuation operation is performed to cause a frequency difference of the probe light to fluctuate by fluctuating frequency of at least one of the light rays of two wavelengths while supplying the electro-optic probe with the detection target electromagnetic wave, and wherein the content of the fluctuation operation conforms to specifications regarding frequency fluctuation of the detection target electromagnetic wave.

\* \* \* \* \*